US012666856B2

(12) United States Patent
Han et al.

(10) Patent No.: US 12,666,856 B2
(45) Date of Patent: Jun. 23, 2026

(54) DISPLAY DEVICE AND METHOD OF FABRICATING THE SAME

(71) Applicant: Samsung Display Co., LTD., Yongin-si (KR)

(72) Inventors: Seo In Han, Cheonan-si (KR); Jae Young Yu, Asan-si (KR); Min Ji Kim, Seoul (KR); Tae Hyun Jung, Seoul (KR); Sung Woo Cho, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 869 days.

(21) Appl. No.: 17/586,170

(22) Filed: Jan. 27, 2022

(65) Prior Publication Data

US 2022/0246894 A1 Aug. 4, 2022

(30) Foreign Application Priority Data

Feb. 4, 2021 (KR) ......................... 10-2021-0015832

(51) Int. Cl.
*H10K 77/10* (2023.01)
*H10K 59/12* (2023.01)
*H10K 59/80* (2023.01)
*H10K 71/00* (2023.01)
(Continued)

(52) U.S. Cl.
CPC ......... *H10K 77/111* (2023.02); *H10K 59/873* (2023.02); *H10K 59/1201* (2023.02); *H10K 71/80* (2023.02); *H10K 71/851* (2023.02); *H10K 2102/311* (2023.02)

(58) Field of Classification Search
CPC ........ H10K 71/00; H10K 50/80; H10K 59/12; H10K 59/1201; H10K 71/80; H10K 71/851; H10K 77/111; H10K 2102/311; H10K 59/873; H10K 59/40; H10K 50/88; H10K 77/00; H10K 71/40; H10K 71/421; H10K 71/441; H10K 50/844; H10K 59/00;
(Continued)

(56) References Cited

U.S. PATENT DOCUMENTS

| 10,141,540 B2 | 11/2018 | Sung et al. |
| 10,396,313 B2 | 8/2019 | Cho |
| 10,411,219 B2 | 9/2019 | Sung et al. |

(Continued)

FOREIGN PATENT DOCUMENTS

| CN | 110444678 A | 11/2019 |
| CN | 111724677 A | 9/2020 |

(Continued)

OTHER PUBLICATIONS

Communication issued Dec. 15, 2025 by the China National Intellectual Property Administration in counterpart Chinese Patent Application No. 202210110921.8.

*Primary Examiner* — Chad M Dicke
*Assistant Examiner* — Gary Abel
(74) *Attorney, Agent, or Firm* — Sughrue Mion, PLLC

(57) ABSTRACT

A display device and a method of fabricating the display device are provided. The display device includes a display panel comprising a surface where images are displayed, and an opposite surface, and a polymer film layer disposed on the opposite surface of the display panel, wherein the polymer film layer comprises grooves recessed toward the display panel.

11 Claims, 21 Drawing Sheets

(51) Int. Cl.
    *H10K 71/80*       (2023.01)
    *H10K 102/00*     (2023.01)

(58) Field of Classification Search
    CPC .. H10K 59/131; H10K 59/1315; G09F 9/301;
                              G09F 9/33
    See application file for complete search history.

(56)             References Cited

U.S. PATENT DOCUMENTS

| | | |
|---|---|---|
| 10,763,454 B2 | 9/2020 | Sung et al. |
| 10,790,475 B2 | 9/2020 | Cho |
| 10,871,802 B2 | 12/2020 | Yug |
| 11,081,660 B2 | 8/2021 | Lee et al. |
| 11,221,645 B2 | 1/2022 | Won |
| 11,347,269 B2 | 5/2022 | Yug et al. |
| 11,362,305 B2 | 6/2022 | Sung et al. |
| 11,690,280 B2 | 6/2023 | Lee et al. |
| 12,156,462 B2 | 11/2024 | Lee et al. |
| 12,197,244 B2 | 1/2025 | Won |
| 12,393,230 B2 | 8/2025 | Yug et al. |
| 2018/0150108 A1* | 5/2018 | Song ..................... G06F 1/1652 |
| 2018/0159086 A1 | 6/2018 | Cho |

| | | |
|---|---|---|
| 2019/0013493 A1* | 1/2019 | Sonoda ................... H10K 71/00 |
| 2019/0341566 A1* | 11/2019 | Lee .......................... B32B 7/022 |
| 2021/0343986 A1* | 11/2021 | Zheng ................... H10K 77/111 |
| 2022/0085305 A1* | 3/2022 | Zhao .................... H10K 77/111 |
| 2022/0100226 A1 | 3/2022 | Won |
| 2022/0246894 A1 | 8/2022 | Han et al. |
| 2023/0040918 A1* | 2/2023 | Jiang ........................ G02B 1/14 |
| 2023/0165068 A1* | 5/2023 | Zhou ................... H10K 59/873 |
| | | 257/72 |
| 2025/0147545 A1 | 5/2025 | Won |
| 2025/0370506 A1 | 12/2025 | Yug et al. |

FOREIGN PATENT DOCUMENTS

| | | | | |
|---|---|---|---|---|
| CN | 111833732 A | 10/2020 | | |
| CN | 112116867 A | 12/2020 | | |
| CN | 114512622 A * | 5/2022 | .............. | G09F 9/30 |
| CN | 217279915 U | 8/2022 | | |
| KR | 2002-0031573 | 5/2002 | | |
| KR | 10-0673073 | 1/2007 | | |
| KR | 10-2015-0010522 | 1/2015 | | |
| KR | 10-2015-0075616 | 7/2015 | | |
| KR | 10-2017-0140490 | 12/2017 | | |
| KR | 10-2020-0091871 | 7/2020 | | |
| KR | 10-2020-0145934 | 12/2020 | | |

\* cited by examiner

CR: CR1, CR2, CR3, CR4, CR5, CR6

DISPLAY DEVICE AND METHOD OF FABRICATING THE SAME

CROSS-REFERENCE TO RELATED APPLICATION(S)

This application claims priority to and benefits of Korean Patent Application No. 10-2021-0015832 under 35 U.S.C. 119, filed on Feb. 4, 2021 in the Korean Intellectual Property Office, the entire contents of which are incorporated herein by reference.

BACKGROUND

1. Technical Field

The disclosure relates to a display device, and a method of fabricating the same.

2. Description of the Related Art

Display devices become more and more important as multimedia technology evolves. Accordingly, a variety of types of display devices such as liquid-crystal display (LCD) devices, organic light-emitting diode (OLED) devices and quantum-dot light-emitting display (QLED) devices are currently used.

A display module for a display device may be fabricated by laminating multiple thin layers several times and delaminating the multiple thin layers. In such processes of fabricating display modules, it may be important to make the lamination process or the delamination process of the layers easier, and to prevent deformation or damage that may occur during the processes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that can reduce damage that may occur during fabrication processes.

Aspects of the disclosure also provide a method of fabricating a display device by which damage that may occur during fabrication processes can be reduced.

An embodiment of a display device may include a display panel comprising a surface where images may be displayed and an opposite surface, and a polymer film layer disposed on the opposite surface of the display panel, wherein the polymer film layer may include grooves recessed toward the display panel.

The polymer film layer may include sides extending in different directions, and corners located between the sides, and the grooves may be disposed in at least one of the corners.

The corners of the polymer film layer may be aligned with edges of the display panel in a thickness direction.

Each of the grooves may extend from an edge of at least one of the corners toward an inside of the polymer film layer in a plan view.

Each of the grooves may extend toward a center of curvature of the at least one of the corners.

The display panel may include a main region including a display area, a bending region extending from the main region, and a subsidiary region extending from the bending region, and the grooves may be located at one of the corners that is located in the main region.

The polymer film layer may include heat-resistant polyethylene terephthalate.

Each of the grooves may include a burr.

The display device may further include an upper stack structure disposed on an upper surface of the display panel.

The display panel may include a circuit driving layer on the substrate, an emissive layer on the circuit driving layer, and an encapsulation layer on the emissive layer.

An embodiment of a method for fabricating a display device may include forming a main cutting line on a display-module mother substrate, forming a subsidiary cutting line intersecting the main cutting line on the display-module mother substrate, and delaminating a carrier layer from the display-module mother substrate.

The forming of the main cutting line on the display-module mother substrate may include forming straight lines and curved lines between the straight lines.

The forming of the subsidiary cutting line intersecting the main cutting line on the display-module mother substrate may include forming a plurality of cutting lines in at least one of the curved lines.

The subsidiary cutting line may extend in a direction intersecting at least one of the curved lines.

The method may further include laminating an adhesive layer and the carrier layer on a polymer film layer of the display-module mother substrate prior to the forming of the main cutting line on the display-module mother substrate.

The adhesive layer may include a pressure-sensitive adhesive.

The polymer film layer may include heat-resistant polyethylene terephthalate.

The delaminating of the carrier layer from the display-module mother substrate may include attaching a removal member on the subsidiary cutting line.

The main cutting line and the subsidiary cutting line may be formed by a laser.

Another embodiment of a method for fabricating a display device may include forming a subsidiary cutting line on a carrier layer, laminating the carrier layer and an adhesive layer on a display-module mother substrate, the adhesive layer being disposed on the carrier layer, and forming a main cutting line on the carrier layer, the adhesive layer and the display-module mother substrate.

It should be noted that aspects of the disclosure are not limited to the above-mentioned aspects. Other aspects of the disclosure will be apparent to those skilled in the art from the following descriptions.

According to an embodiment of the disclosure, it may be possible to reduce damage in a display device that may occur during fabrication processes.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

3

Figure 1:
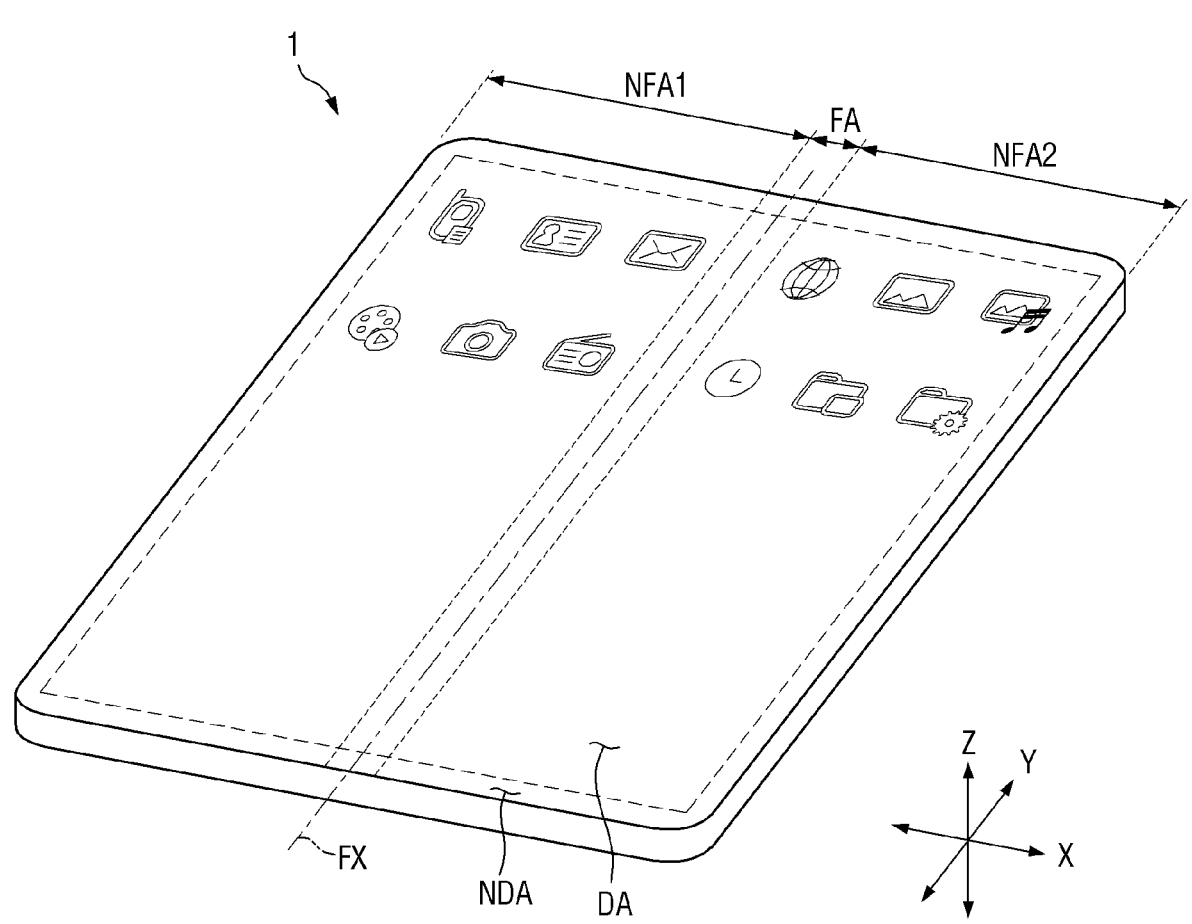

FIG. 1 is a schematic perspective view of a display device according to an embodiment of the disclosure.

Figure 2:
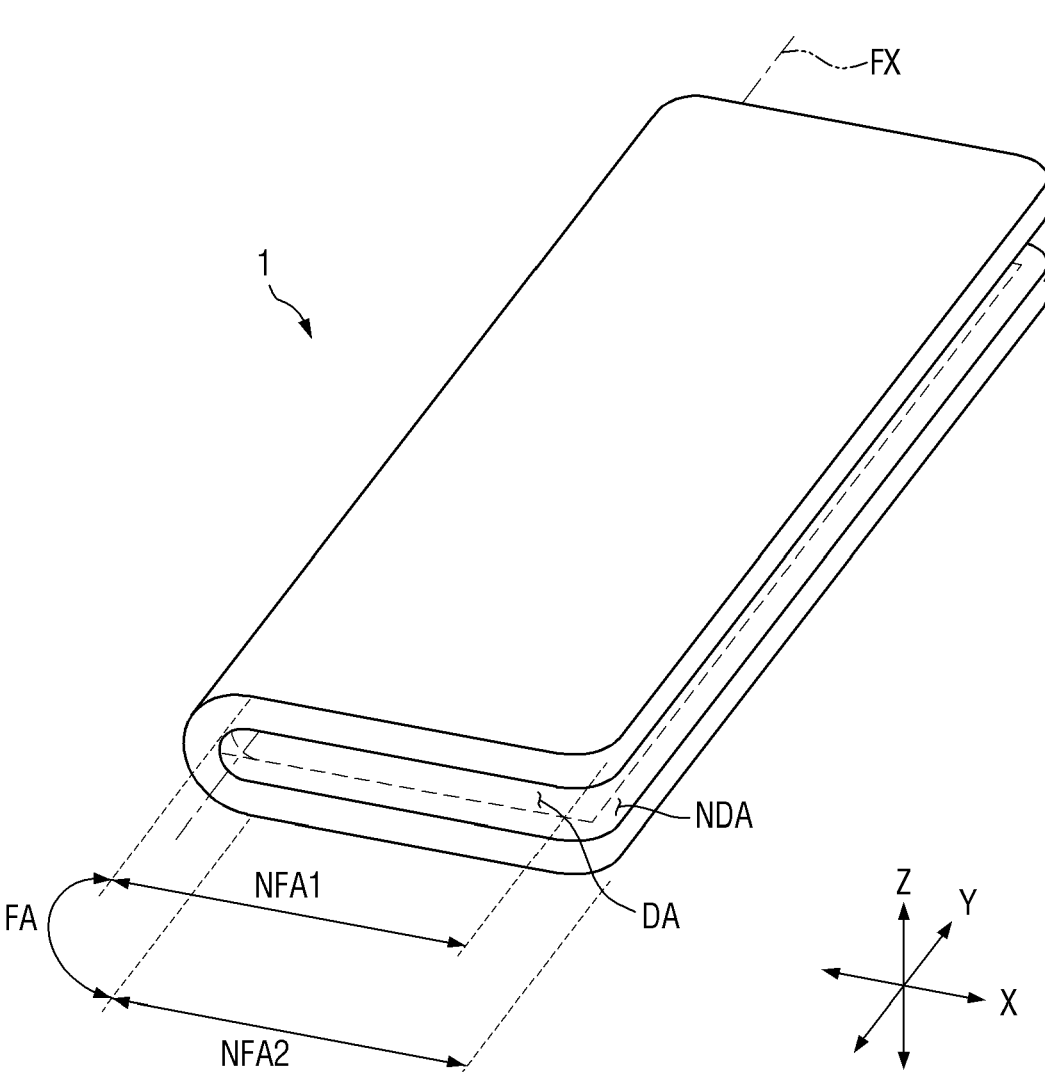

FIG. 2 is a schematic perspective view of a display device according to an embodiment of the disclosure in case that the display device is folded.

Figure 3:
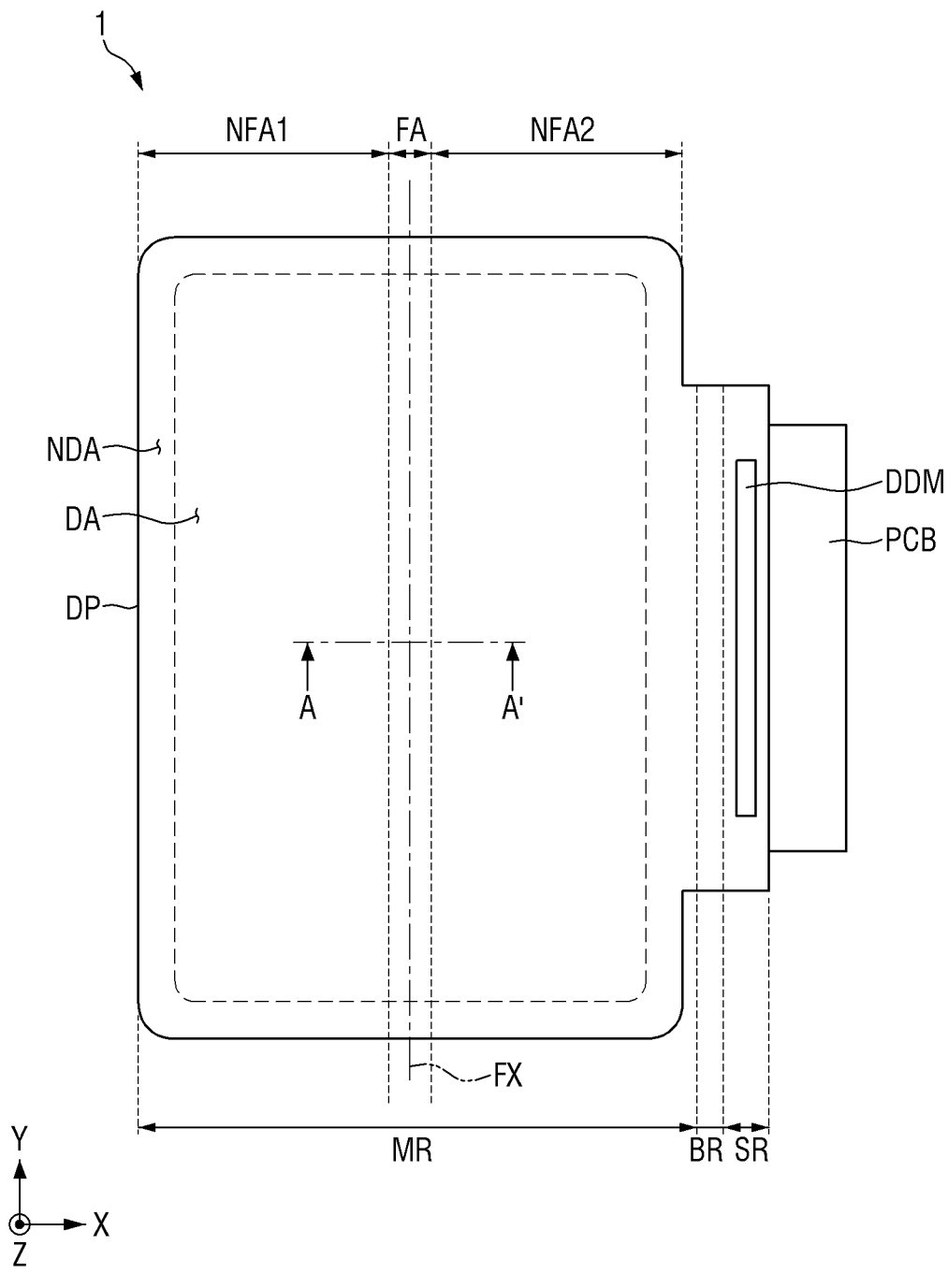

FIG. 3 is a schematic plan view showing an upper surface of a display panel according to an embodiment of the disclosure.

Figure 4:
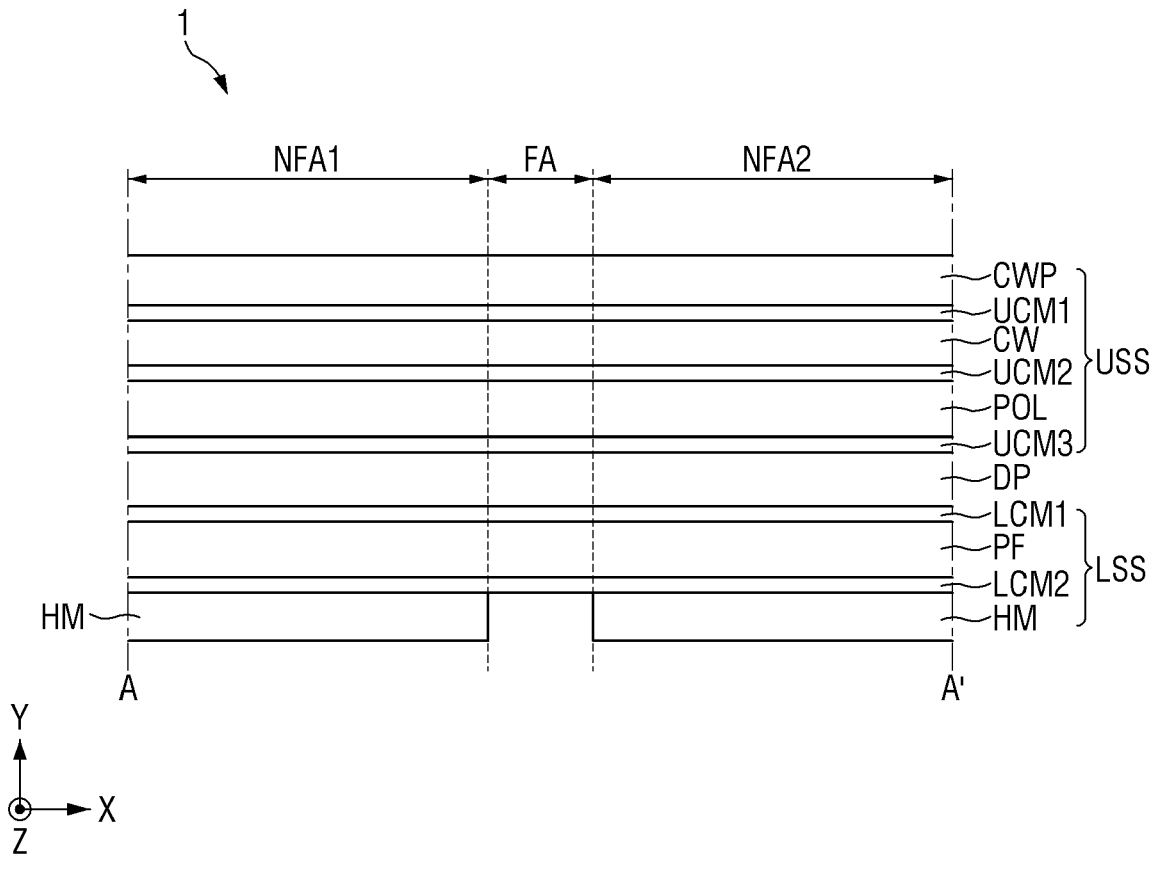

FIG. 4 is a schematic cross-sectional view taken along line A-A' of FIG. 3.

Figure 5:
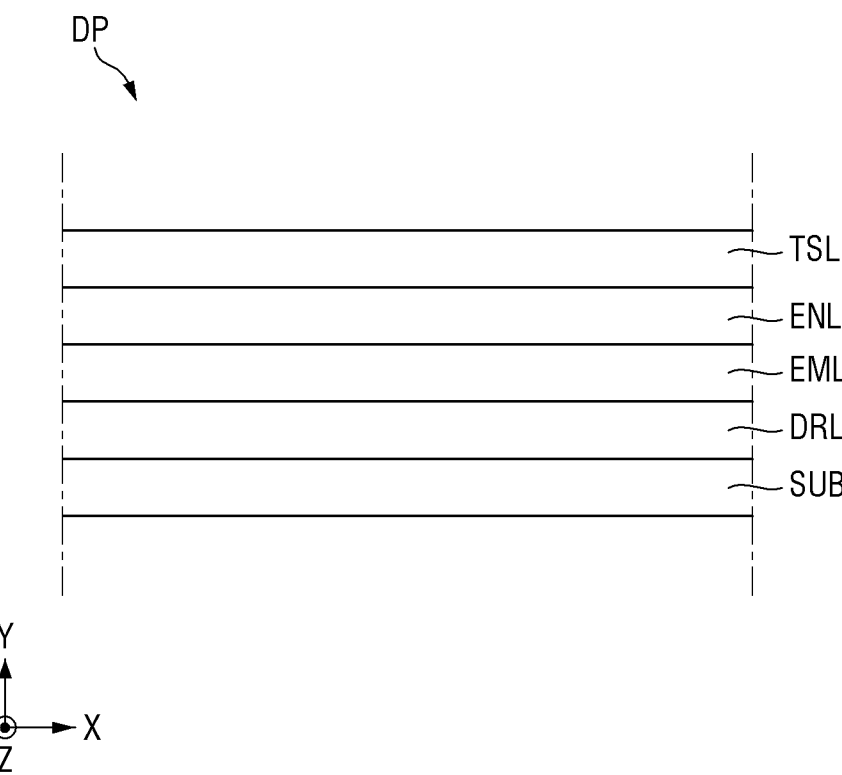

FIG. 5 is a schematic cross-sectional view of the display panel of FIG. 4.

Figure 6:
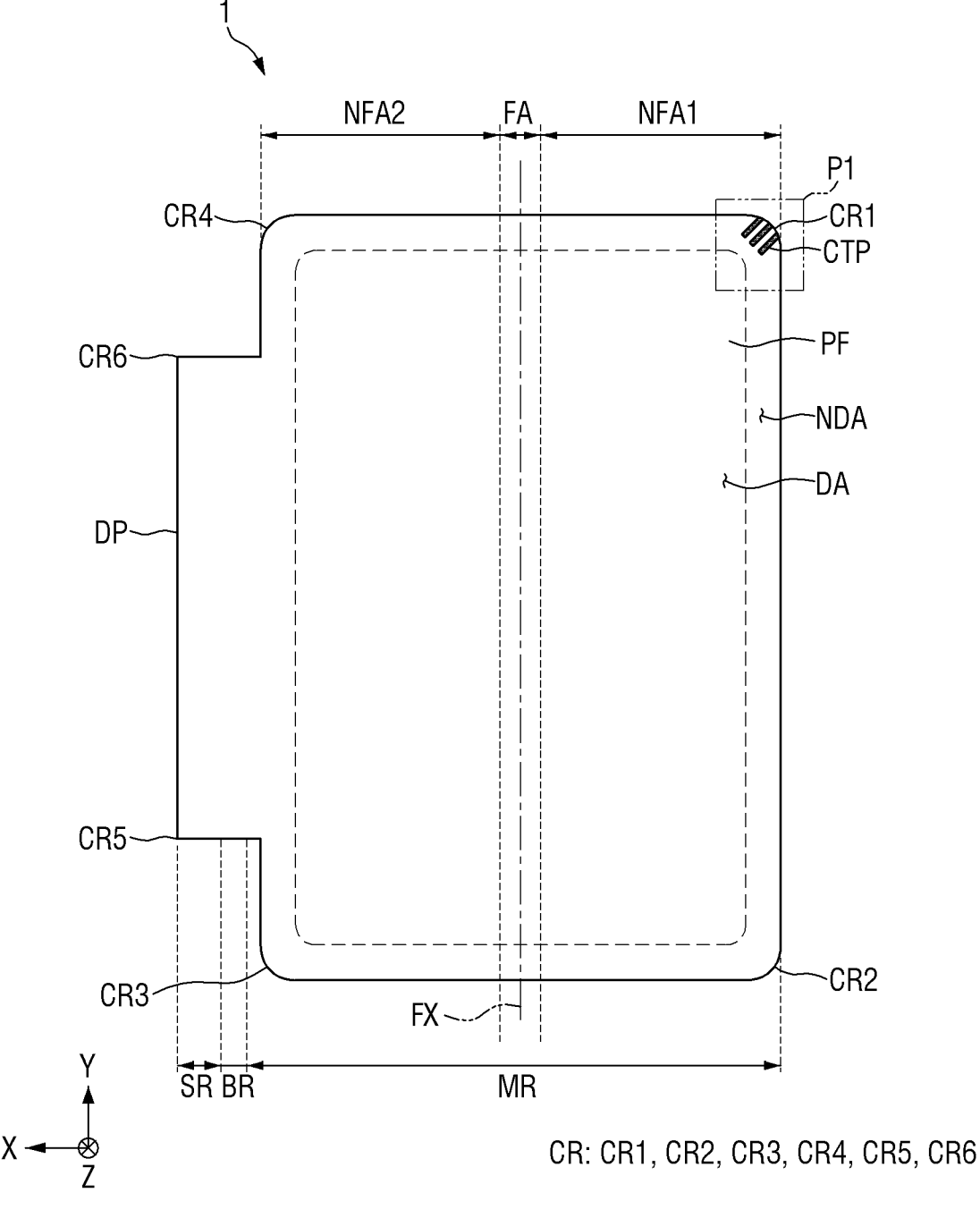

FIG. 6 is a schematic plan view showing a lower surface of a display panel according to an embodiment of the disclosure.

Figure 7:
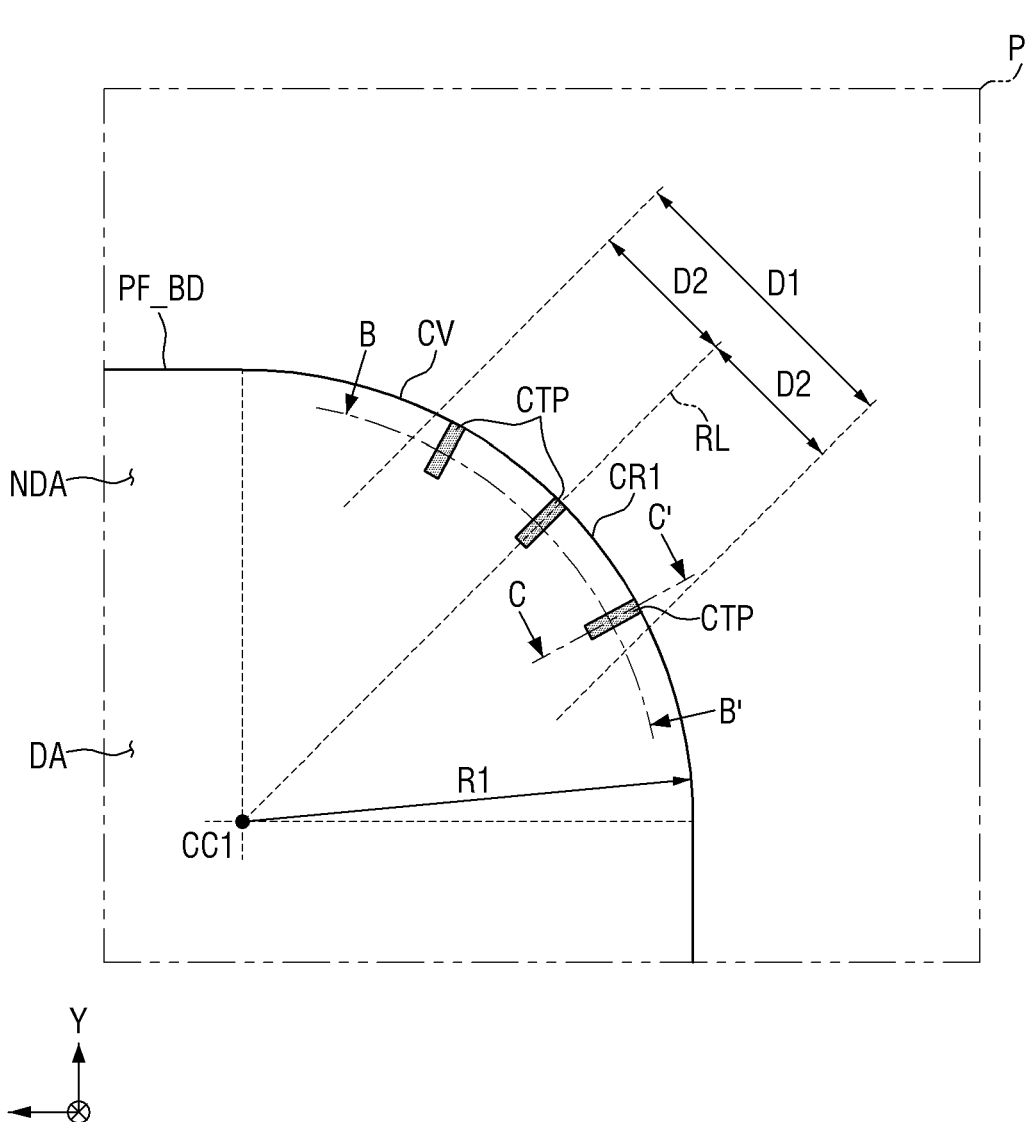

FIG. 7 is an enlarged schematic plan view of portion P1 of FIG. 6.

Figure 8:
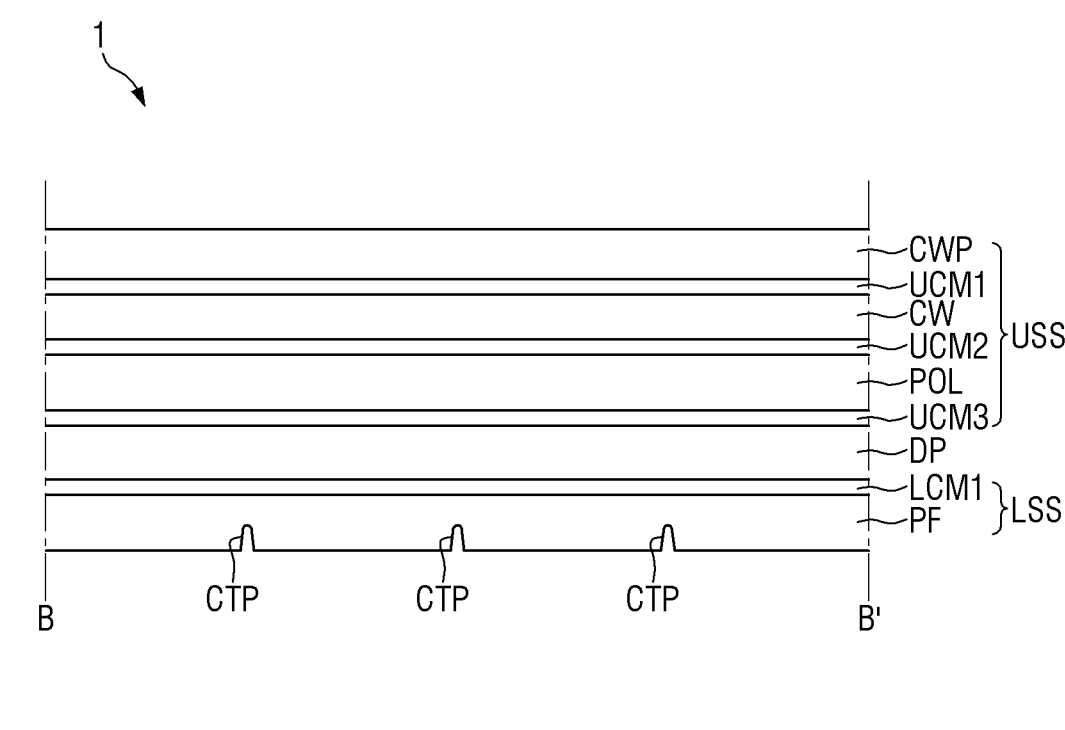

FIG. 8 is a schematic cross-sectional view taken along line B-B' of FIG. 7.

Figure 9:
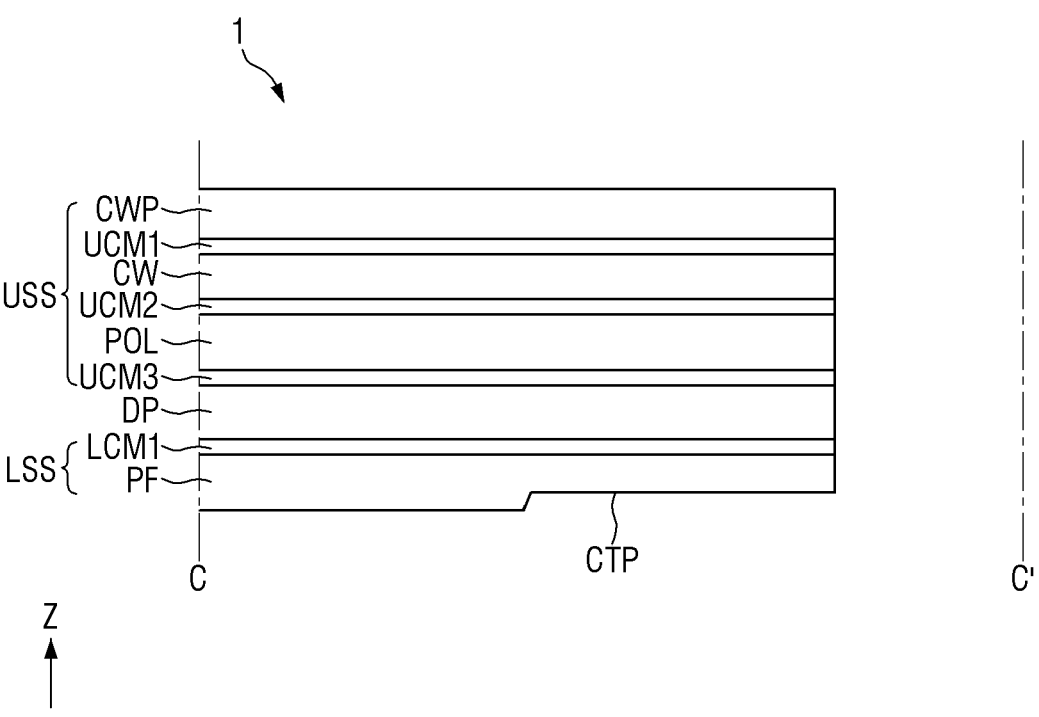

FIG. 9 is a schematic cross-sectional view taken along line C-C' of FIG. 7.

Figure 10:
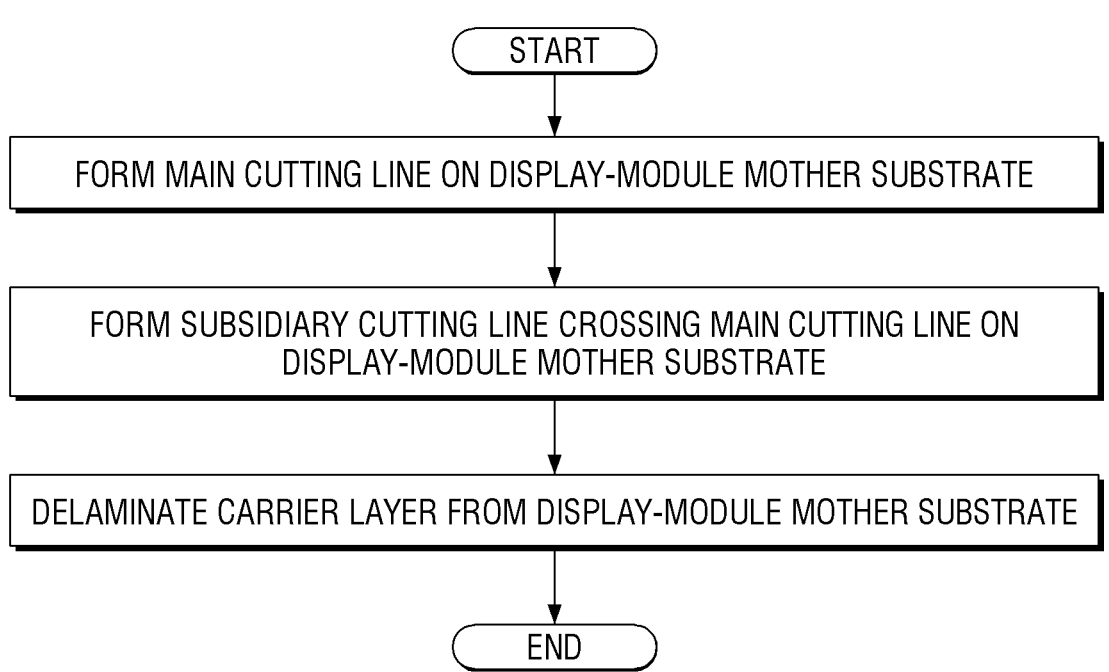

FIG. 10 is a flowchart for illustrating a method for fabricating a display device according to an embodiment of the disclosure.

FIGS. 11 to 18 are schematic views showing processing steps of a method of fabricating a display device according to an embodiment of the disclosure.

Figure 19:
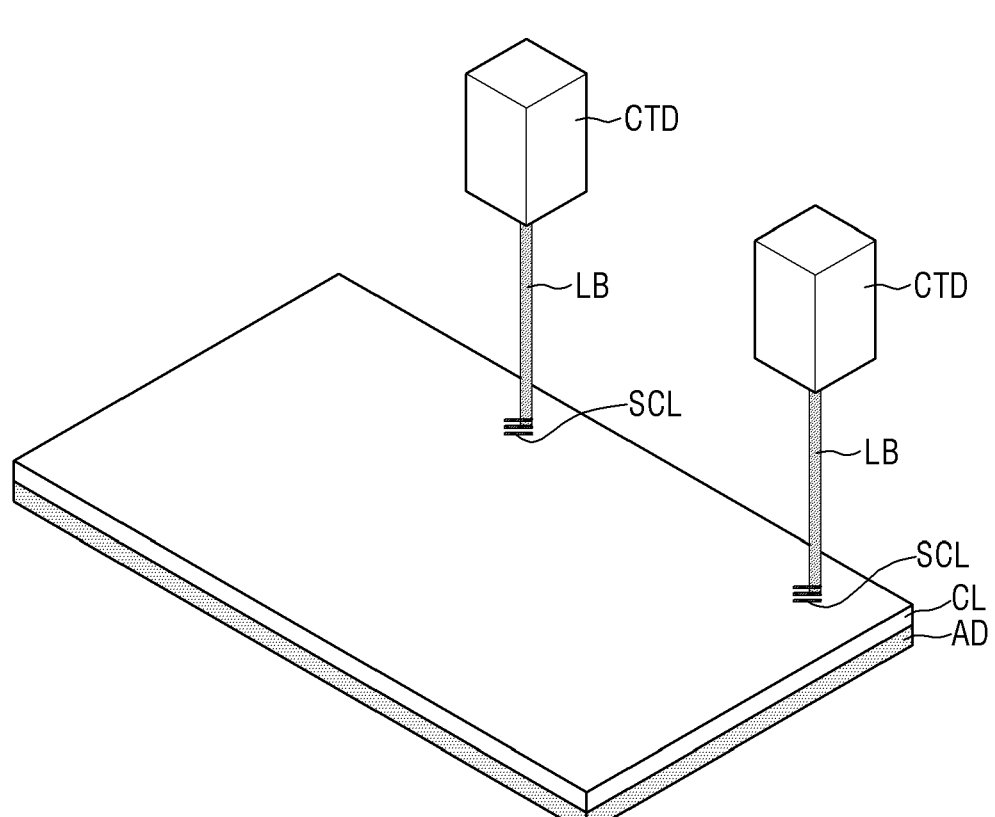
Figure 20:
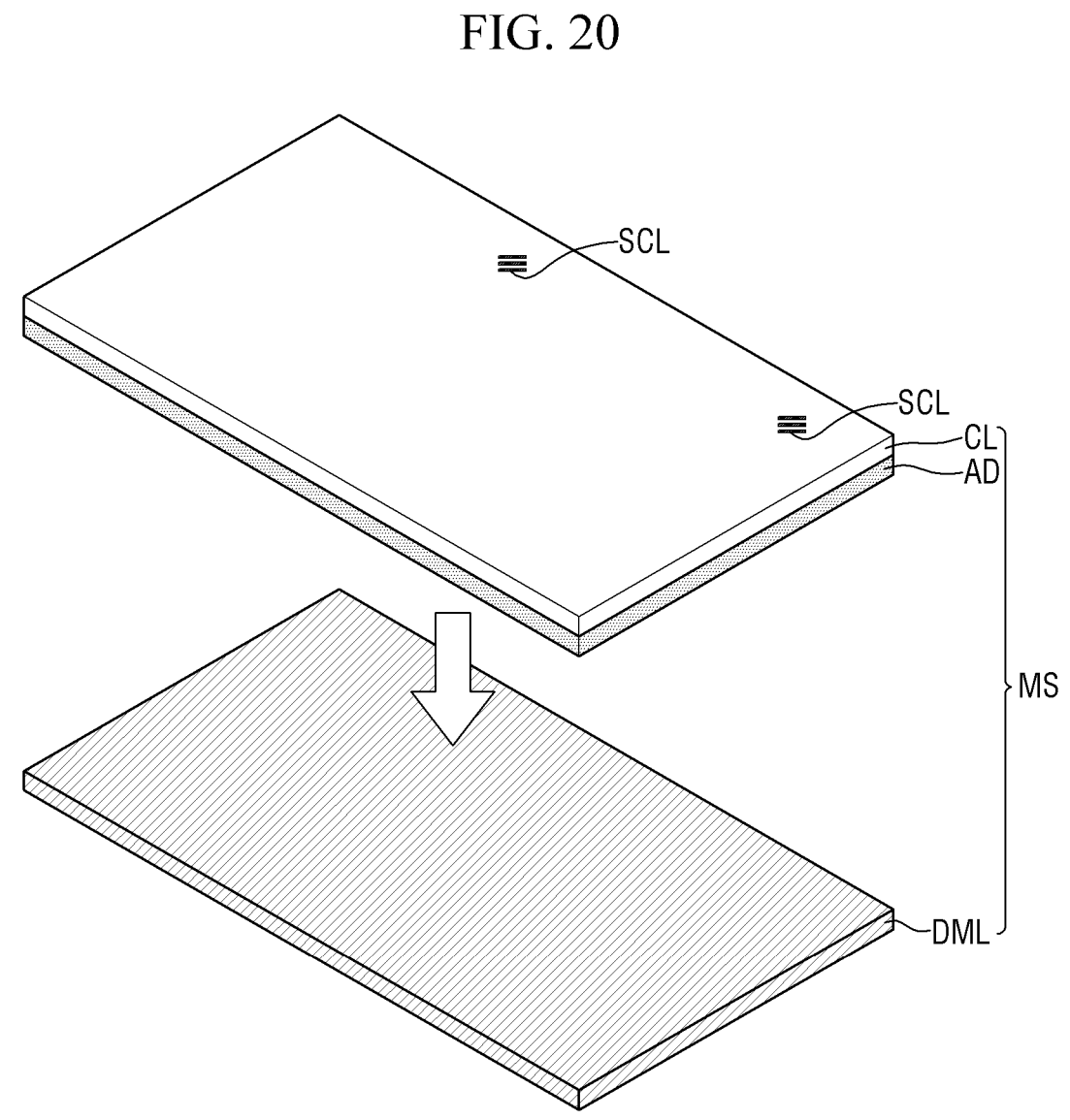
Figure 21:
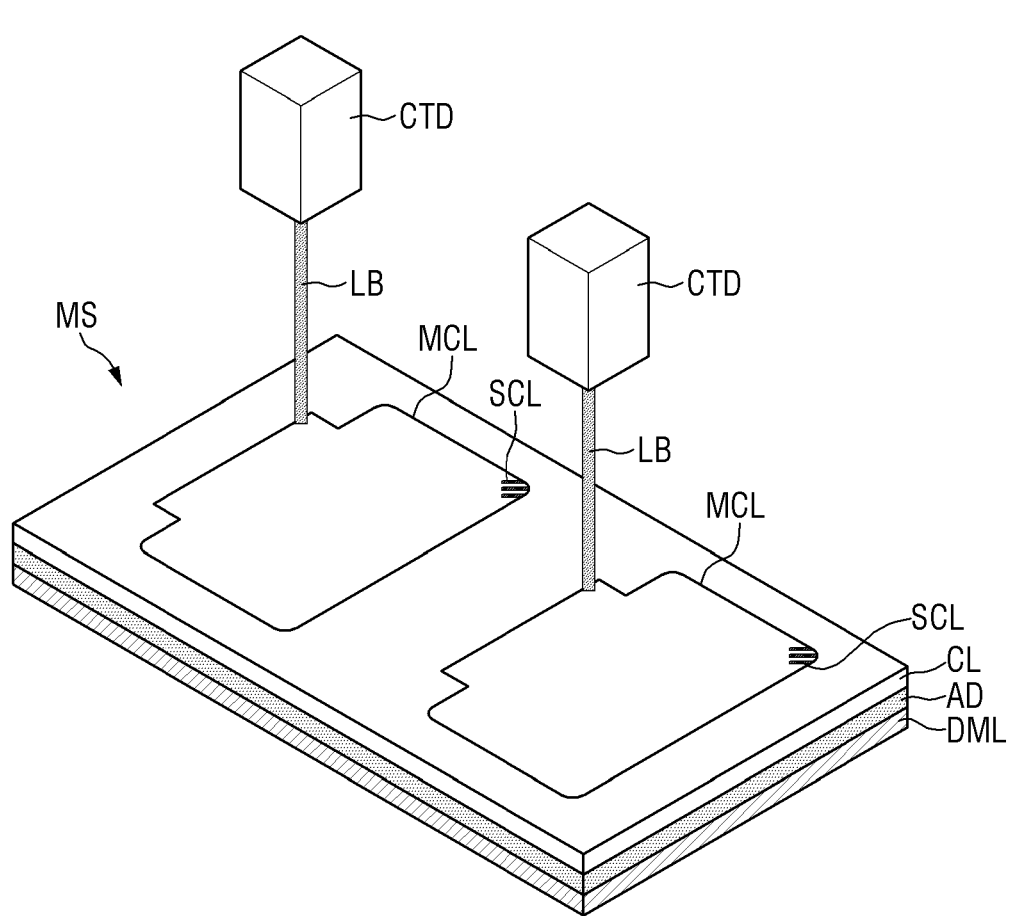

FIGS. 19 to 21 are schematic views showing processing steps of a method of fabricating a display device according to another embodiment of the disclosure.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" may include a physical or electrical connection or coupling.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other.

"About", "approximately", and "substantially", as used herein, are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display device according to an embodiment of the disclosure. FIG. 2 is a schematic perspective view of a display device according to an embodiment of the disclosure in case that the display device is folded.

In the following description, a first direction X, a second direction Y and a third direction Z may be different directions and intersect one another. For example, the first direction X may be a width direction, the second direction Y may be a length direction, and the third direction Z may be a thickness direction and/or a height direction. The first direction X, the second direction Y and/or the third direction Z may refer to the directions indicated by arrows in the drawings, respectively. It is, however, to be understood that the disclosure is not limited thereto. The first direction X, the second direction Y and the third direction Z may refer to the opposite directions to the directions indicated by the arrows in the drawings, respectively. For example, the third direction Z may include an upward direction toward the upper side of the drawings, and a downward direction toward the lower side of the drawings. In this instance, a first surface of an element that faces the upper side may be referred to as an upper surface, while an opposite surface of the element that faces the lower side may be referred to as a lower surface. The upward direction, the downward direction, the upper surface and the lower surface may be referred to as a front direction, a rear direction, a front surface and a rear surface, respectively. It is to be noted that the directions and names may be relative and are not limited by those described above.

A display device 1 according to an embodiment of the disclosure may include a variety of devices that display images or videos. Examples of the display device 1 include, but are not limited to, a smart phone, a mobile phone, a tablet PC, a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various inspection devices, various home appliances such as a refrigerator and a laundry machine, Internet of things (IoT) devices, etc.

Referring to FIG. 1, the display device 1 may have a rectangular shape in plan view. According to an embodiment of the disclosure, the display device 1 may have two shorter sides extended in the first direction X and two longer sides extended in the second direction Y intersecting the first direction X in plan view. It is, however, to be understood that the disclosure is not limited thereto. The display device 1 may have a variety of shapes.

The display device 1 may include a display area DA and a non-display area NDA.

The display area DA may display images or videos. Pixels may be disposed in the display area DA. As shown in FIG. 1, the display area DA may be disposed on an upper surface of display device 1. For example, the upper surface may be a surface on which images may be displayed. It is, however, to be understood that the disclosure is not limited thereto. The display area DA may be further disposed on at least one of the lower surface and side surfaces of the display device 1.

The non-display area NDA may not display any image or video. The non-display area NDA may be disposed adjacent to (e.g., around) the display area DA. The non-display area NDA may surround the display area DA. The non-display area NDA may be an area in which a light-blocking member such as a black matrix may be disposed. According to an embodiment of the disclosure, the display area DA may have a rectangular shape, and the non-display area NDA may be disposed along the four sides of the display area DA. It is, however, to be understood that the disclosure is not limited thereto.

Referring to FIGS. 1 and 2, the display device 1 may be a foldable device that can be folded or unfolded.

The display device 1 may be folded along a folding axis FX. According to an embodiment of the disclosure, the folding axis FX may be extended in the second direction Y. However, embodiments are not so limited and the folding axis FX may be extended, e.g., in the first direction X. In case that the display device 1 is unfolded, the folding axis FX may overlap a folding area FA in plan view. Although not shown in the drawings, there may be more than one folding axis FX. The folding axis FX may refer to a rotation axis around which a part of the display device 1 rotates with respect to another part thereof.

The display device 1 may be divided into the folding area FA and non-folding areas NFA1 and NFA2.

The folding area FA may be an area that may be folded or bent in case that the display device 1 is folded. The non-folding areas NFA1 and NFA2 may be areas that remain flat without being folded or bent in case that the display device 1 is folded.

The non-folding areas NFA1 and NFA2 may include a first non-folding area NFA1 and a second non-folding area NFA2.

The first non-folding area NFA1 and the second non-folding area NFA2 may be arranged in the first direction X, and the folding area FA may be disposed between the first non-folding area NFA1 and the second non-folding area NFA2.

The display device 1 may be folded so that the first non-folding area NFA1 overlaps the second non-folding area NFA2 or the first non-folding area NFA1 may be inclined with respect to the second non-folding area NFA2, or may be unfolded flat.

For example, the display device 1 may be folded so that the first non-folding area NFA1 forms an angle greater than approximately 0° and less than approximately 1800 with respect to the second non-folding area NFA2, or may be unfolded so that they form an angle of approximately 180°.

As shown in FIG. 1, in case that the display device 1 is unfolded, the first non-folding area NFA1, the folding area FA and the second non-folding area NFA2 may spread out flat so that they may not overlap each other in the thickness direction.

As shown in FIG. 2, in case that the display device 1 is folded, the first non-folding area NFA1 and the second non-folding area NFA2 may overlap each other in the thickness direction.

Although not shown in the drawings, in case that the display device 1 is folded, the first non-folding area NFA1 and the second non-folding area NFA2 may be disposed such that they may be inclined with respect to each other. In such case, at least a part of the first non-folding area NFA1 and at least a part of the second non-folding area NFA2 may or may not overlap each other in the thickness direction.

According to an embodiment of the disclosure, one folding area FA and two non-folding areas NFA1 and NFA2 are illustrated, but the number and arrangement of the folding area FA and the non-folding area FA are not limited thereto. Although not shown in the drawings, each of the elements of the display device 1 may also be divided into the folding area FA and/or the non-folding areas NFA1 and NFA2.

As shown in FIG. 2, the display device 1 may be folded inward. In case that the display device is folded inward, at least a part of the display area DA may not be exposed to the outside.

For example, the display device 1 may be folded so that a part of the display area DA faces another part of the display area DA. In case that the display device 1 is completely folded, the display area DA may be surrounded by at least one other element forming an exterior of the display device 1 so that the display area DA may not be exposed to the outside.

The display device 1 may have an unfolded state and a folded state. The display device 1 may be configured so that it can be freely switched between the unfolded state and the folded state.

As shown in FIG. 1, the first non-folding area NFA1 and the second non-folding area NFA2 may be arranged side by side on a plane in the unfolded state. As shown in FIG. 2, the first non-folding area NFA1 and the second non-folding area NFA2 may be arranged in parallel to each other and may completely overlap each other in the thickness direction in the folded state.

Although not shown in the drawings, the folded state may further include a state in which the first non-folding area NFA1 and the second non-folding area NFA2 may be half-folded. In other words, the first non-folding area NFA1 (or the second non-folding area NFA2) may be disposed to be inclined with respect to the second non-folding area NFA2 (or the first non-folding area NFA1). In such case, the first non-folding area NFA1 and the second non-folding area NFA2 may partially overlap each other or may not overlap each other depending on the angle between the first non-folding area NFA1 and the second non-folding area NFA2.

For example, in the unfolded state, the angle between the first non-folding area NFA1 and the second non-folding area NFA2 of the display device 1 may be approximately 180°, and in the folded state, the angle between the first non-folding area NFA1 and the second non-folding area NFA2 of the display device 1 may be approximately 0° or more and less than approximately 180° and/or more than approximately 180° and less than approximately 360°.

In FIGS. 1 and 2, the foldable display device 1 is illustrated as the display device 1, but the disclosure is not limited thereto. The display device 1 may be a bendable display device 1 or a rollable display device 1. In other embodiments, the display device 1 may be a rigid, flat panel display device 1.

FIG. 3 is a schematic plan view showing an upper surface of a display panel according to an embodiment of the disclosure.

Referring to FIG. 3, the display device 1 may include a display panel DP where images may be displayed.

For example, an organic light-emitting display (OLED) panel may be employed as the display panel DP. In the following embodiments, the organic light-emitting display panel DP is employed as the display panel DP, but the disclosure is not limited thereto. Other types of display panels DP may be employed, such as a liquid-crystal display (LCD) panel, a field emission display (FED) panel, an electrophoresis display panel and a quantum-dot light-emitting display (QLED) panel.

The display panel DP may have a generally rectangular shape in plan view. In this instance, two corners CR (see FIG. 6) of the display panel DP (substrate SUB) closer to a printed circuit board PCB to be described later may be cut into an 'L' shape. It is, however, to be understood that the disclosure is not limited thereto.

The display panel DP may include the display area DA where images or videos may be displayed, and the non-display area NDA disposed around the display area DA. The display area DA may have a generally rectangular shape in plan view, and the non-display area NDA may be disposed in a generally band shape surrounding the display area DA. It is, however, to be understood that the disclosure is not limited thereto.

The display panel DP may include a main region MR, a bending region BR connected to the main region MR, and a subsidiary region SR connected to the bending region BR. Although not shown in the drawings, the elements stacked on the display panel DP may also be divided into the main region MR, the bending region BR, and the subsidiary region SR.

The main region MR may be disposed across the first non-folding area NFA1, the folding area FA, and the second non-folding area NFA2. The display area DA may be located in the main region MR. The main region MR may have a generally rectangular shape having two shorter sides in the first direction X and two longer sides in the second direction Y in plan view, but the disclosure is not limited thereto.

The bending region BR may be extended from the main region MR. The bending region BR may be connected (e.g., extended) to a side of the main region MR to connect the main region MR with the subsidiary region SR. According to an embodiment of the disclosure, the bending region BR may be connected to the side where the longer side of the main region MR may be located (e.g., the right side of FIG. 3). It is, however, to be understood that the disclosure is not limited thereto. The bending region BR may be connected to a side where the shorter side of the main region MR may be located (e.g., the lower side of FIG. 3).

The subsidiary region SR may be extended from the bending region BR. A driving member DDM, which will be described later, may be disposed in the subsidiary region SR. As shown in FIG. 3, lengths of the bending region BR and the subsidiary region SR in the second direction Y may be smaller than the length of the main region MR. It is, however, to be understood that the disclosure is not limited thereto.

Although not shown in the drawings, the bending region BR may be bent away from the display side (toward the rear side for a top-emission display device). In such case, the subsidiary region SR may overlap the main region MR in the thickness direction. It is to be noted that the bending direction of the bending region BR is not limited to the above example. The bending region BR may be bent toward the display side (the front side), for example.

The display device 1 may further include a driving member DDM that drives pixel circuits of the display panel DP.

The driving member DDM may be mounted on the subsidiary region SR of the display panel DP, but the disclosure is not limited thereto. According to an embodiment of the disclosure, the driving member DDM may be mounted on the display panel DP, for example, by a chip on plastic (COP) technique. The driving member DDM may be mounted by a chip on film (COF) technique or a chip on glass (COG) technique, for example.

The display device 1 may further include the printed circuit board PCB. The printed circuit board PCB may be attached to the subsidiary region SR of the substrate SUB, which will be described later. In such case, as shown in FIG. 1, in case that the display panel DP is unfolded, the driving member DDM may be disposed between the printed circuit board PCB and the bending region BR in plan view. The printed circuit board PCB may include a rigid circuit board, a flexible printed circuit board PCB, a flexible printed circuit film, etc., or a combination thereof.

FIG. 4 is a schematic cross-sectional view taken along line A-A' of FIG. 3. FIG. 5 is a schematic cross-sectional view of the display panel of FIG. 4.

Referring to FIG. 4, the display device 1 may further include an upper stack structure USS stacked on a first surface of the display panel DP, and a lower stack structure LSS stacked on an opposite surface to the first surface of the display panel DP. The display panel DP, the upper stack structure USS, the lower stack structure LSS, the printed circuit board PCB and the driving member DDM may form a single display module.

On a first surface of the display panel DP, images or videos may be displayed. The first surface of the display panel DP may be an upper surface (e.g., a front surface) of the display panel DP, and the opposite surface of the display panel DP may be a lower surface (rear surface) of the display panel DP.

The upper stack structure USS may include a polarizing member POL, a cover window CW and a cover window protection layer CWP sequentially stacked on one another from the display panel DP toward the upper side.

The polarizing member POL may be disposed on the upper surface of the display panel DP. The polarizing member POL may polarize the light passing therethrough. The polarizing member POL can reduce the reflection of external light. The polarizing member POL may be a polarizing film. The polarizing member POL may be replaced by an anti-reflection member including color filters and a black matrix disposed therebetween.

The cover window CW may be disposed on an upper surface of the polarizing member POL. The cover window CW can protect the display panel DP. The cover window CW may be made of a transparent material. The cover window CW may include, for example, glass, plastic, or a combination thereof. According to an embodiment of the disclosure, the cover window CW may be made of, but is not limited to, glass.

The cover window protection layer CWP may be disposed on an upper surface of the cover window CW. The cover window protection layer CWP may include, for example, at least one selected from the group of polyethylene terephthalate (PET), polyethylene naphthalate (PEN), polyether sulfone (PES), polyimide (PI), polyarylate (PAR), polycarbonate (PC), polymethyl methacrylate (PMMA) and cyclo olefin copolymer (COC) resin.

The upper stack structure USS may include upper coupling members UCM1, UCM2 and UCM3 that may couple the adjacent ones of the elements stacked on one another. The upper coupling members UCM1, UCM2 and UCM3 may be optically transparent. The upper coupling members UCM1, UCM2 and UCM3 may include an optically transparent adhesive, an optically transparent resin, a pressure sensitive adhesive (PSA), or a combination thereof.

According to an embodiment of the disclosure, a first upper coupling member UCM1 may be disposed between the cover window protection layer CWP and the cover window CW to couple the cover window protection layer CWP and the cover window CW, a second upper coupling member UCM2 may be disposed between the cover window CW and the polarizing member POL to couple the cover window CW and the polarizing member POL, and a third upper coupling member UCM3 may be disposed between the polarizing member POL and the display panel DP to couple the polarizing member POL and the display panel DP. The first upper coupling member UCM1, the second upper coupling member UCM2 and the third upper coupling member UCM3 may be referred to as a cover window protection layer coupling member, a cover window coupling member, and a polarizing member coupling member, respectively.

The lower stack structure LSS may include a polymer film layer PF and a heat-dissipating member HM sequentially stacked on one another from the display panel DP to the lower side.

The polymer film layer PF may include a polymer film. The polymer film layer PF may support the display panel DP. The polymer film layer PF may include, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), cycloolefin polymer (COP), etc., or a combination thereof.

The polyethylene terephthalate may be heat-resistant polyethylene terephthalate (reinforced polyethylene terephthalate). According to an embodiment of the disclosure, the polymer film layer PF may be made mainly of heat-resistant polyethylene terephthalate. In this instance, the polymer film layer PF may have a melting point of approximately 265°, a heat distortion temperature of approximately 240°, and a continuous heat resistance temperature of approximately 150°. It is to be noted that the material and properties of the polymer film layer PF are not limited thereto.

Heat-resistant polyethylene terephthalate may be prepared by a process that applies thermal stabilization or heat stabilization, or an additive that improves heat resistance may be blended. For example, heat-resistant polyethylene terephthalate may be produced by performing high-temperature molding or molding at a mold temperature (e.g., about 130° C. to about 140° C.) at which polyethylene terephthalate crystallizes and performing heating and cooling. For another example, the heat-resistant polyethylene terephthalate may further include a reinforcement such as glass fiber.

Although not shown in the drawings, the polymer film layer PF may include a functional layer on at least one surface. The functional layer may include, for example, a planarization layer, a shock-absorbing layer, a digitizer layer, an electromagnetic-wave blocking layer, a light-absorbing layer, etc.

The heat-dissipating member HM may be disposed on a lower surface of the polymer film layer PF. The heat-dissipating member HM may serve to diffuse heat generated from the display panel DP or the other elements of the display device 1. The heat-dissipating member HM may include a metal plate. The metal plate may include, for example, a metal having excellent thermal conductivity such as copper and silver. The heat-dissipating member HM may be a heat dissipation sheet including graphite or carbon nanotubes. In some embodiments, the heat-dissipating member HM and a second lower coupling member LCM2 to be described later may be eliminated.

Although not limited thereto, the heat-dissipating member HM may be disconnected with respect to the folding axis FX in order to facilitate the folding of the display device 1 as shown in FIGS. 3 and 4. For example, a first metal plate may be disposed in the first non-folding area NFA1, and a second metal plate may be disposed in the second non-folding area NFA2. The first metal plate and the second metal plate may be physically spaced apart from each other with respect to the folding axis FX.

The lower stack structure LSS may include lower coupling members LCM1 and LCM2 that may couple adjacent ones of the elements stacked on one another. The lower coupling members LCM1 and LCM2 may be optically transparent. The lower coupling members LCM1 and LCM2 may include an optically transparent adhesive, an optically transparent resin, a pressure sensitive adhesive (PSA), or a combination thereof.

According to an embodiment of the disclosure, the first lower coupling member LCM1 may be disposed between the display panel DP and the polymer film layer PF to couple the display panel DP and the polymer film layer PF, and the second lower coupling member LCM2 may be disposed between the polymer film layer PF and the heat-dissipating member HM to couple the polymer film layer PF and the heat-dissipating member HM. According to an embodiment of the disclosure, the first lower coupling member LCM1 and the second lower coupling member LCM2 may be formed of, but are not limited to, a pressure sensitive adhesive (PSA). The first lower coupling member LCM1 and the second lower coupling member LCM2 may be referred to as a polymer film layer (PF) coupling member and a heat-dissipating member (HM) coupling member, respectively.

Referring to FIG. 5, the display panel DP may include a substrate SUB, a circuit driving layer DRL on the substrate SUB, an emissive layer EML on the circuit driving layer DRL, an encapsulation layer ENL on the emissive layer EML, and a touch layer TSL on the encapsulation layer ENL.

The substrate SUB may be a flexible substrate including a flexible polymer material such as polyimide. Accordingly, the display panel DP may be curved, bent, folded, or rolled.

The circuit-driving layer DRL may be disposed on the substrate SUB. The circuit-driving layer DRL may include a circuit for driving an emissive layer EML of each pixel. The circuit-driving layer DRL may include thin-film transistors.

The emissive layer EML may be disposed on the circuit-driving layer DRL. The emissive layer EML may include an organic emitting layer. The emissive layer EML may emit light with various luminance depending on driving signals transmitted from the circuit-driving layer DRL.

The encapsulation layer ENL may be disposed on the emissive layer EML. The encapsulation layer ENL may include an inorganic film or a stack of an inorganic film and an organic film.

The touch layer TSL may be disposed on the encapsulation layer ENL. The touch layer TSL may sense a touch input and may perform the functions of the touch member. The touch layer TSL may include sensing regions and sensing electrodes. According to an embodiment of the disclosure, the touch layer TSL may be provided inside the display panel DP and included in the display panel DP, but the disclosure is not limited thereto. The touch member may be implemented as a panel or film separate from the display panel DP and attached to the display panel DP.

FIG. 6 is a schematic plan view showing a lower surface of a display panel according to an embodiment of the disclosure. FIG. 7 is an enlarged schematic plan view of portion P1 of FIG. 6. FIG. 8 is a schematic cross-sectional view taken along line B-B' of FIG. 7. FIG. 9 is a schematic cross-sectional view taken along line C-C' of FIG. 7.

In FIG. 6, the display panel DP is flipped over. For convenience of illustration, the heat-dissipating member HM and the printed circuit board PCB are not depicted in FIG. 6.

Referring to FIG. 6, as described above, a polymer film layer PF may be stacked on the lower surface of the display panel DP.

The polymer film layer PF may be disposed to cover the lower surface of the display panel DP in plan view. In FIG. 6, the lower surface of the display panel DP may be completely covered by the polymer film layer PF and may not be seen. It is, however, to be understood that the disclosure is not limited thereto. The polymer film layer PF may be disposed to expose a part of the lower surface of the display panel DP.

The polymer film layer PF may be disposed in the first non-folding area NFA1, the folding area FA and the second non-folding area NFA2. The polymer film layer PF may be mainly disposed in the main region MR. In FIG. 6, the polymer film layer PF may be disposed in the main region MR, the bending region BR and the subsidiary region SR, but the disclosure is not limited thereto. For example, the polymer film layer PF may be disposed only in the main region MR.

As shown in FIG. 6, the polymer film layer PF may be disposed in the shape conforming to the shape of the display panel DP. The polymer film layer PF may have a generally rectangular shape in plan view. One side of the polymer film layer PF (e.g., the left side of FIG. 6) may protrude in the first direction X so that it covers the bending region BR and the subsidiary region SR in plan view. It is, however, to be understood that the disclosure is not limited thereto.

The polymer film layer PF may have two shorter sides in the first direction X and one longer side in the second direction Y in plan view. Although not shown in the drawings, in case that the polymer film layer PF may not protrude in the first direction X, the polymer film layer PF may further have another longer side in the second direction Y.

The polymer film layer PF may include corners CR each formed as two adjacent sides extended in different directions meet each other in plan view.

As shown in FIG. 6, the corners CR may include four corners CR positioned in the main region MR, and two corners CR positioned in the subsidiary region SR. It is, however, to be understood that the disclosure is not limited thereto. If the polymer film layer PF is not disposed in the subsidiary region SR, the two corners CR positioned in the subsidiary region SR may be eliminated.

The four corners CR positioned in the main region MR may form edges PF_BD (see FIG. 7) of the display panel DP and the polymer film layer PF, and may be located between adjacent sides extended in different directions. According to an embodiment of the disclosure, each of the four corners CR located in the main region may be located between the longer side extended in the second direction Y (e.g., the right longer side in FIG. 6) and the shorter side extended in the first direction X (e.g., the upper shorter side or the lower shorter side in FIG. 6), or may be located between the shorter side extended in the second direction Y (e.g., one of the two left shorter sides of FIG. 6) and the shorter side extended in the first direction X (e.g., the upper shorter side or the lower shorter side in FIG. 6). It is, however, to be understood that the disclosure is not limited thereto. The lengths of the sides forming the edges PF_BD of the display panel DP and the polymer film layer PF disposed in the main region MR may vary depending on the design of the display device 1.

In the following description, for convenience of illustration, the four corner portions CR positioned at the upper right, lower right, lower left and upper left ends of the main region MR may be referred to as a first corner CR1, a second corner CR2, a third corner CR3 and a fourth corner CR4, respectively, in the clockwise direction. The corners CR positioned at the lower and upper ends of the subsidiary region SR may be referred to as a fifth corner CR5 and a sixth corner CR6, respectively.

The first corner CR1 and the second corner CR2 may be located in the first non-folding area NFA1, and the third corner CR3 and the fourth corner CR4 may be located in the second non-folding area NFA2. The first corner CR and the second corner CR2 may be disposed adjacent to the longer side extended in the second direction Y and may be connected to the longer side. As shown in FIG. 6, the longer side may be the right longer side which may not be connected to the bending region BR. The third corner CR3 and the fourth corner CR4 may be positioned adjacent to the bending region BR. As shown in FIG. 6, the third corner CR3 and the fourth corner CR4 may be located on a side (left side of FIG. 6) of the main region MR which may be connected to the bending region BR.

In FIG. 6, the first corner CR1, the second corner CR2, the third corner CR3 and the fourth corner CR4 may be rounded, but the disclosure is not limited thereto. The corners CR of the main region MR may have a sharp or angular shape.

The polymer film layer PF may include grooves CTP formed in a lower surface of the polymer film layer PF.

The grooves CTP may be disposed at the corners CR of the polymer film layer PF. According to an embodiment of the disclosure, the grooves CTP may be located at the corners CR located in the main region MR. The grooves CTP may be disposed in at least one of the first corner CR1 and the second corner CR2 among the first corner CR1, the second corner CR2, the third corner CR3 and the fourth corner CR4 of the main region MR, which may be farthest from the printed circuit board PCB, the bending region BR and/or the subsidiary region SR in plan view. For example, the grooves CTP may be disposed at the first corner CR1. In such case, the grooves CTP may be spaced apart from the bending region BR to the extent that the design allows, so that a carrier layer CL (see FIG. 11), which will be described later, can be easily delaminated. It is, however, to be understood that the disclosure is not limited thereto. The grooves CTP may be disposed in at least one of the third corner CR3, the fourth corner CR4, the fifth corner CR5 and the sixth corner CR6.

The grooves CTP may be disposed in the non-display area NDA. It is, however, to be understood that the disclosure is not limited thereto. Parts of the grooves CTP may be disposed across the non-display area NDA and the display area DA.

According to an embodiment of the disclosure, grooves CTP may be disposed at the multiple corners CR in substantially the same or similar manner. Therefore, only grooves CTP formed at the first corner CR1 will be described to avoid redundant description.

Referring further to FIG. 7, as described above, the grooves CTP may be disposed at the first corner CR1. The grooves CTP may be disposed only at the first corner CR1 having a curved edge in plan view. It is, however, to be understood that the disclosure is not limited thereto. Grooves CTP may be further formed at one of the two sides that may be adjacent to the first corner CR1 and extend straight.

According to an embodiment of the disclosure, three grooves CTP may be formed at the first corner CR1. It is to be understood that the number of grooves CTP formed at a corner CR is not limited thereto. For example, only one groove CTP may be formed at the first corner CR1, or two grooves CTP or four or more grooves CTP may be formed at the first corner CR1.

Each of the grooves CTP may have a side in contact with the edge of the first corner CR1 and may be extended toward the inside of the display device 1 in plan view. Specifically, the grooves CTP may be extended toward the inside of the polymer film layer PF from the edge PF_BD of the polymer film layer PF positioned at the first corner CR1 in plan view. The edge PF_BD of the polymer film layer PF may be substantially identical to the edge of the display panel DP. The length of the grooves CTP may be smaller than the radius of curvature R1 of the first corner CR1, but the disclosure is not limited thereto.

According to an embodiment of the disclosure, the grooves CTP may be extended toward the center of curvature CC1 of the first corner CR1. In this instance, the direction in which the grooves CTP may be extended may be perpendicular to the normal line of the edge PF_BD of the polymer film layer PF positioned at the first corner CR1. It is to be noted that the direction in which the grooves CTP may be extended is not limited thereto. The grooves CTP may be extended generally toward the inside of the display device 1 and may be arranged in parallel to each other.

The grooves CTP may be arranged within a first width D1. The first width D1 may be measured between the two outermost grooves CTP among the grooves CTP. The direction in which the first width D1 may be measured may be perpendicular to a reference line RL to be described later, but the disclosure is not limited thereto.

The first width D1 may be smaller than the width of the first corner CR1. The width of the first corner CR1 may be measured between the two ends of the portion CV having a curvature in plan view. The first width D1 may be equal to or less than the width of a removal member RT (see FIG. 17), which will be described later. For example, the first width D1 may be, but is not limited to, approximately 0.1 mm to approximately 20 mm.

The grooves CTP may be arranged symmetrically with respect to the reference line RL. Specifically, the grooves CTP may be disposed within a first distance D2 from the reference line RL. The reference line RL may pass through the center of curvature CC1 of the first corner CR1 and equally divide the edge of the first corner CR1. The reference line RL may be extended in a diagonal direction to form an angle of approximately 45° with the first direction X and/or the second direction Y. The first distance D2 may be measured in the direction perpendicular to the reference line RL. According to an embodiment of the disclosure, the center one of the grooves CTP may overlap the reference line RL while the other grooves CTP may be spaced apart from the reference line RL by the first distance D2 in plan view. It is, however, to be understood that the disclosure is not limited thereto. The grooves CTP may not overlap the reference line RL or may be arranged asymmetrically with respect to the reference line RL.

According to an embodiment of the disclosure, the grooves CTP may be arranged at a regular interval, but the disclosure is not limited thereto. The grooves CTP may be arranged at irregular intervals.

Referring to FIGS. 8 and 9, the grooves CTP may be recessed from the lower surface of the polymer film layer PF in the thickness direction (direction toward the display panel DP). The lower surface of the polymer film layer PF may be a surface opposite to the upper surface of the polymer film layer PF facing the display panel DP.

The grooves CTP may be formed so that they may not penetrate through the polymer film layer PF. For example, the grooves CTP may have a very shallow depth of approximately 1 μm to approximately 100 μm. Accordingly, the grooves CTP may not be easily recognized from the outside. To do so, the polymer film layer PF may have a thickness of approximately μm to approximately 200 μm, but the depth of the grooves CTP and the thickness of the polymer film layer PF are not limited thereto.

Referring to FIG. 8, the grooves CTP may have a tapered shape, i.e., a width becoming narrower toward the upper side and/or the display panel DP in the cross section cut parallel to the edge of the first corner CR1. The upper side may refer to the side on which images may be displayed or the screen may be located.

The tip of each of the grooves CTP adjacent to the display panel DP may have a generally round shape. However, the shape of each of the grooves CTP is not limited thereto. Each of the grooves CTP may have various shapes such as a rectangle, a square, a triangle, a circle and an oval in cross section.

Referring to FIG. 9, the grooves CTP may be formed to be extended to the edge PF_BD of the polymer film layer PF in the cross-section cut parallel to the direction in which the grooves CTP may be extended. In the cross-section, there may be a level difference between the edge PF_BD of the polymer film layer PF and a portion adjacent thereto. The edge PF_BD of the polymer film layer PF where the groove CTP may be formed and the portion adjacent thereto may be a smaller thickness than the thickness of the polymer film where the groove CTP may not be formed. The edge PF_BD of the polymer film layer PF may refer to the boundary of the polymer film layer PF.

As will be described later, the polymer film layer PF may be cut together with the display panel DP. Accordingly, at least a part of the edge PF_BD of the polymer film layer PF may be substantially identical to the edge of the display panel DP. For example, the polymer film layer PF may have generally the same shape as the display panel DP in plan view. Accordingly, the edge PF_BD of the polymer film layer PF may be aligned with the edge of the display panel DP in the thickness direction in the cross section. It is, however, to be understood that the disclosure is not limited thereto. The polymer film layer PF may have a shape different from that of the display panel DP in plan view. The edge PF_BD of the polymer film layer PF may not be aligned with the edge of the display panel DP.

The lower surface of the polymer film layer PF where the grooves CTP may be formed may be extended generally parallel to the display panel DP. The thickness of the polymer film layer PF where the grooves CTP may be formed may be generally constant in the cross section. It is, however, to be understood that the disclosure is not limited thereto. The lower surface of the polymer film layer PF may be extended obliquely to the display panel DP, and the thickness of the polymer film layer PF where the grooves CTP may be formed may become thinner or thicker toward the edge PF_BD of the polymer film layer PF.

As described later, the grooves CTP may be traces of subsidiary cutting lines SCL (see FIG. 13) which may be formed so that the carrier layer can be easily delaminated during the process of fabricating the display device 1. The grooves CTP may include burrs formed by laser etching, etc. Hereinafter, a method of fabricating a display device will be described with reference to FIGS. 10 to 18.

FIG. 10 is a flowchart for illustrating a method of fabricating a display device according to an embodiment of the disclosure. FIGS. 11 to 18 are schematic views showing processing steps of a method of fabricating a display device according to an embodiment of the disclosure.

The display device fabricated by the following method may include the display device 1 of FIGS. 1 to 9.

Referring to FIGS. 10 to 18, a method of fabricating a display device according to an embodiment may include forming a main cutting line MCL on a display-module mother substrate MS; forming subsidiary cutting lines SCL intersecting the main cutting line MCL on the display-module mother substrate MS; and delaminating a carrier layer CL of the display-module mother substrate MS.

The method of fabricating a display device is not limited to the above-described embodiment, and at least some of the above steps may be omitted, or one or more steps may be added according to other embodiments of the disclosure.

Hereinafter, the method of fabricating a display device will be described in detail with reference to FIGS. 11 to 18.

Figure 11:
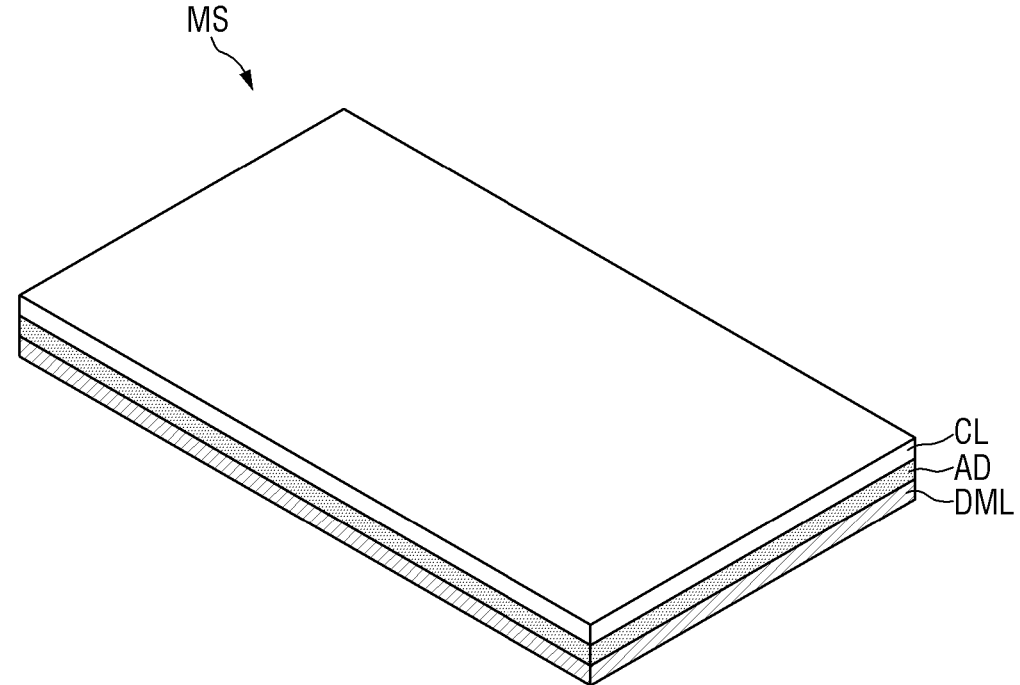

Referring to FIG. 11, a display-module mother substrate MS may be prepared.

The display-module mother substrate MS may be a large substrate that serves as a basis for fabricating display modules. Typically, a display module for a display device, such as an organic light-emitting display device and a liquid-crystal display device, and a display panel included therein may be fabricated by cutting a single mother substrate into pieces.

The display-module mother substrate MS may include a display module layer DML, an adhesive layer AD on the display module layer DML, and a carrier layer CL on the adhesive layer AD.

Figure 15:
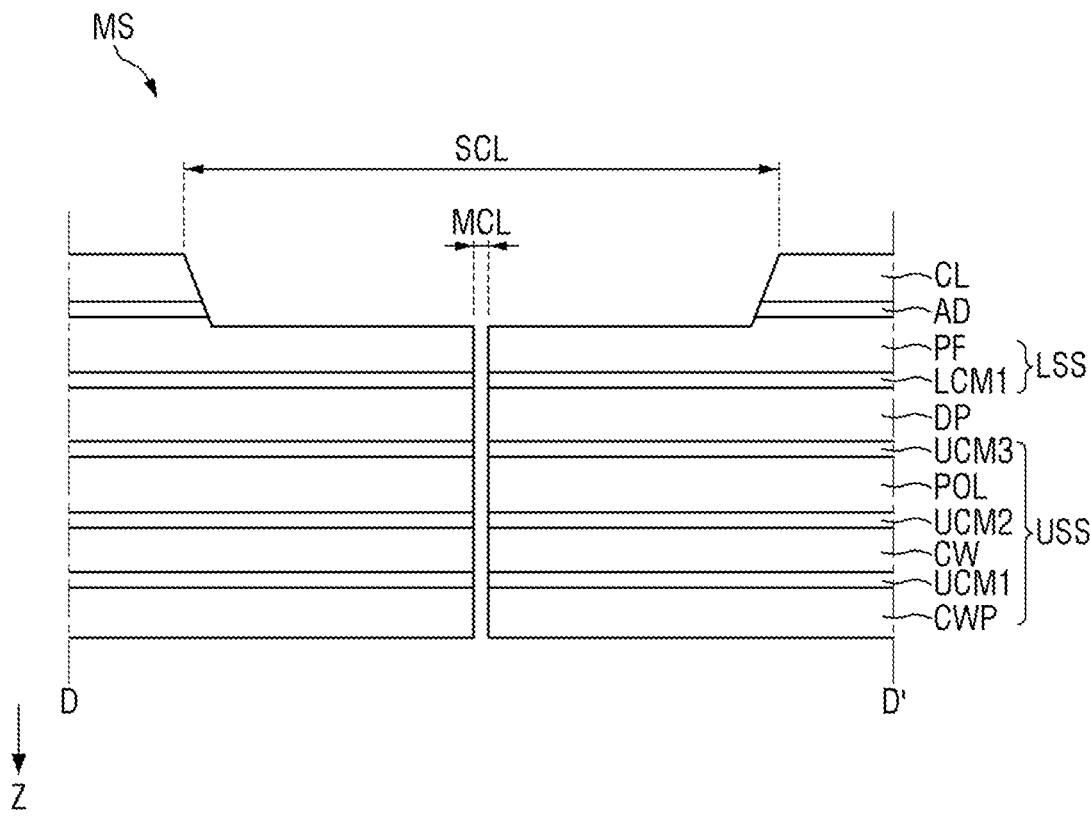
Figure 16:
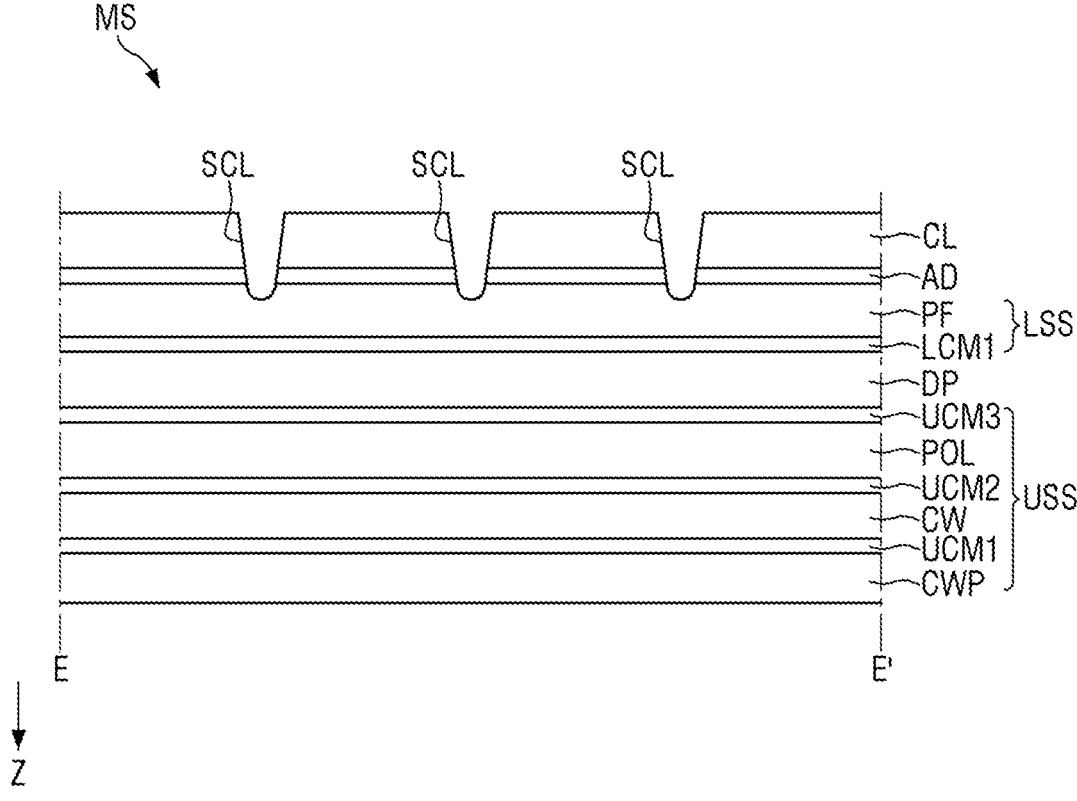

The display module layer DML may include elements for emitting light and circuits for driving the elements. Referring to FIGS. 4 and 5, for example, the display module layer DML may include the display panel DP, the upper stack structure USS and the lower stack structure LSS shown in FIGS. 4 and 5. Referring to FIGS. 15 and 16, during the fabrication process, the display module layer DML may be inverted so that the upper stack structure USS, the display panel DP and the lower stack structure LSS may be stacked on one another in this order. It is, however, to be understood that the disclosure is not limited thereto.

The display module layer DML may be formed as at least some of the upper stack structure USS and at least some of the lower stack structure LSS may be stacked on one another. According to an embodiment of the disclosure, as shown in FIGS. 15 and 16 below, the display module layer DML may be formed with only some of the lower stack structure LSS including the polymer film layer laminated on a lower surface of the display panel DP, and the adhesive layer AD and the carrier layer CL may be laminated on the polymer film layer PF. The layers (e.g., all the layers) of the upper stack structure USS may be laminated, but the disclosure is not limited thereto. In the display module layer DML, the heat-dissipating member HM and the second lower coupling member LCM2 of the lower stack structure LSS may not be laminated yet, or the heat-dissipating member HM and the second lower coupling member LCM2 may be eliminated.

The adhesive layer AD may be interposed between the display module layer DML and the carrier layer CL. The adhesive layer AD may include an adhesive such as an optically transparent adhesive, an optically transparent resin, a pressure sensitive adhesive (PSA), or a combination thereof. According to an embodiment of the disclosure, the adhesive layer AD may be made of, but is not limited to, a pressure-sensitive adhesive.

Referring to FIGS. 15 and 16, the adhesive layer AD may be stacked on the polymer film layer PF. The adhesive layer AD may have adhesiveness and may be removed from the display module layer DML together with the carrier layer CL in case that the carrier layer CL is delaminated, which will be described later. It is, however, to be understood that the disclosure is not limited thereto. In case that the carrier layer CL is delaminated, at least a part of the adhesive layer AD may remain on the display module layer DML.

The carrier layer CL can support the display module layer DML during the process of fabricating the display device to facilitate the process. According to an embodiment of the disclosure, the carrier layer CL may be formed of, but is not limited to, a thin film type member. The carrier layer CL may be attached to the display module layer DML by the adhesive layer AD during the process of fabricating the display device 1. After the display-module mother substrate MS has been cut, the carrier layer CL may be delaminated from the display module layer DML.

Although not shown in the drawings, two dummy release papers may be attached to the upper and lower surfaces of the carrier layer CL, respectively, and the carrier layer CL may be transferred from the outside. After, one of the dummy release papers that may be attached to the lower surface of the carrier layer CL may be removed, and the carrier layer CL may be attached to the display module layer DML. Subsequently, after the other dummy release paper that may be attached to the upper surface of the carrier layer CL may be removed, a process of cutting the display module layer DML may be carried out. It is, however, to be understood that the disclosure is not limited thereto. The cutting process may be carried out without removing the other dummy release paper.

Figure 12:
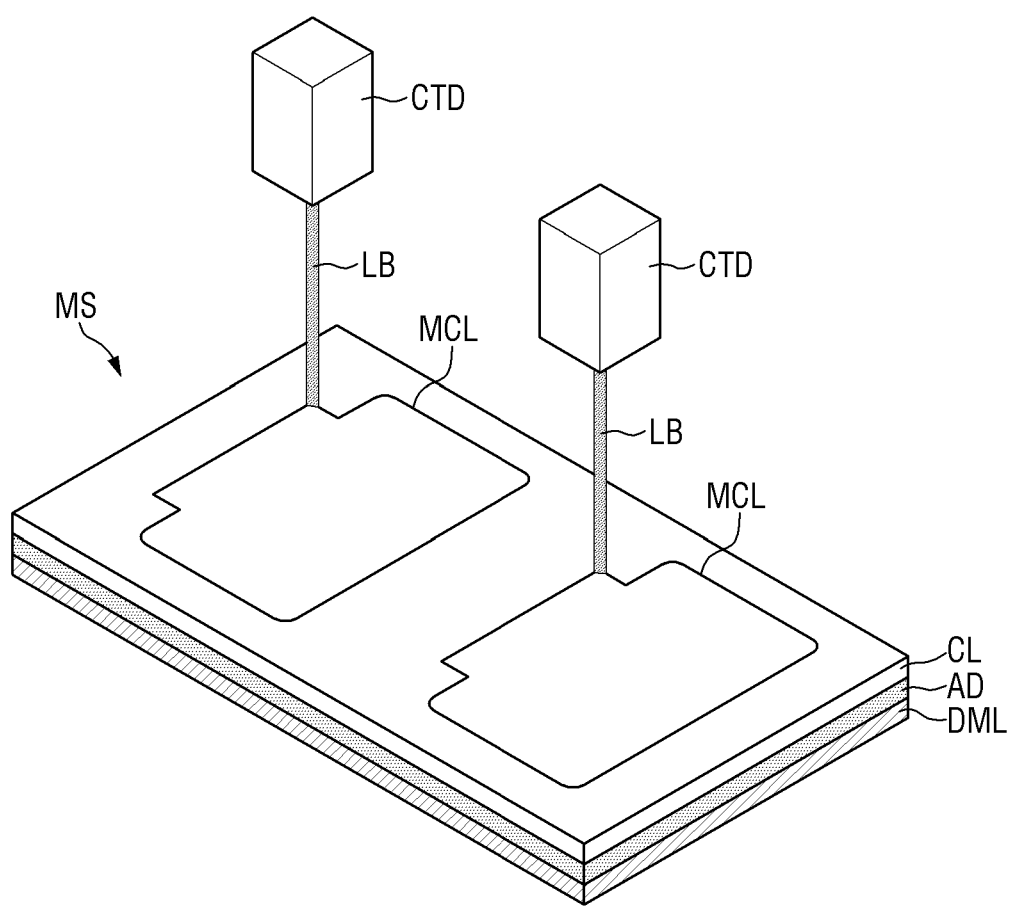

Referring to FIG. 12, after the display-module mother substrate MS may be prepared, a first cutting process may be carried out. The first cutting process may be performed by laser cutting. In the first cutting process, a laser light source CTD may emit a laser LB with a relatively high power to perform full cutting through the display-module mother substrate MS. For example, the laser emitted from the laser light source CTD may be, but is not limited to, a femtosecond laser.

In the first cutting process, the laser light source CTD may move to draw a closed curve based on the shape of the display panel DP to be fabricated. In such case, the upper stack structure USS and the lower stack structure LSS laminated on the display panel DP may also be cut together with the display panel DP to have substantially the same shape as the display panel DP in plan view.

The main cutting line MCL may be formed on the display-module mother substrate MS by the first cutting process. The main cutting line MCL may be substantially the same as the outer line of the display panel DP shown in FIGS. 3, 6 and 12. For example, the laser light source CTD may move along a closed curve of a generally rectangular shape with rounded corners, like the edge of the display panel DP shown in FIGS. 3, 6 and 12 in plan view to cut the display-module mother substrate MS. In such case, the laser light source CTD may cut the display-module mother substrate MS so that one side of the rectangular shape protrudes in plan view to form the bending region BR and the subsidiary region, but the disclosure is not limited thereto.

Figure 13:
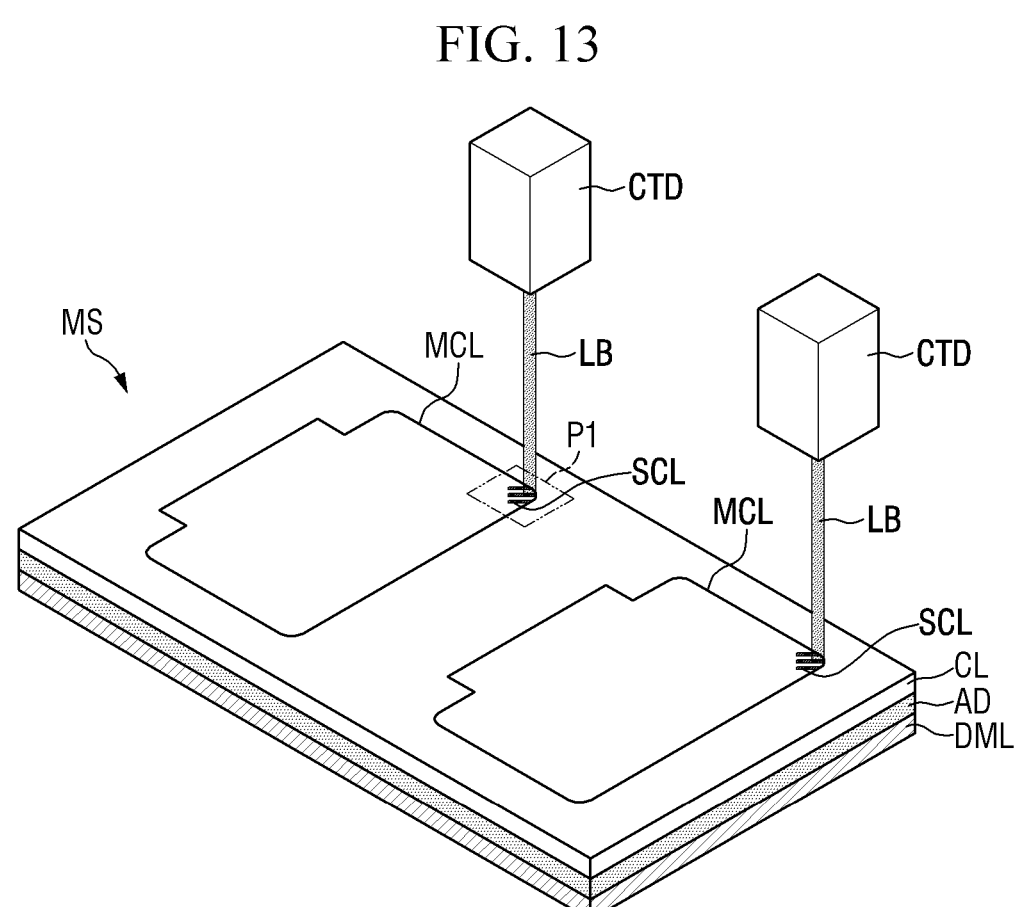

Referring to FIG. 13, a second cutting process may be carried out after the first cutting process has been completed.

The second cutting process may be performed by laser cutting. In the second cutting process, the laser light source CTD may emit a laser LB with a lower power than in the first cutting process to perform a more shallow cut (e.g., half cutting) without penetrating through the display-module mother substrate MS. It is, however, to be understood that the disclosure is not limited thereto. The second cutting process may be carried out by physical cutting using a cutting device or the like.

Figure 14:
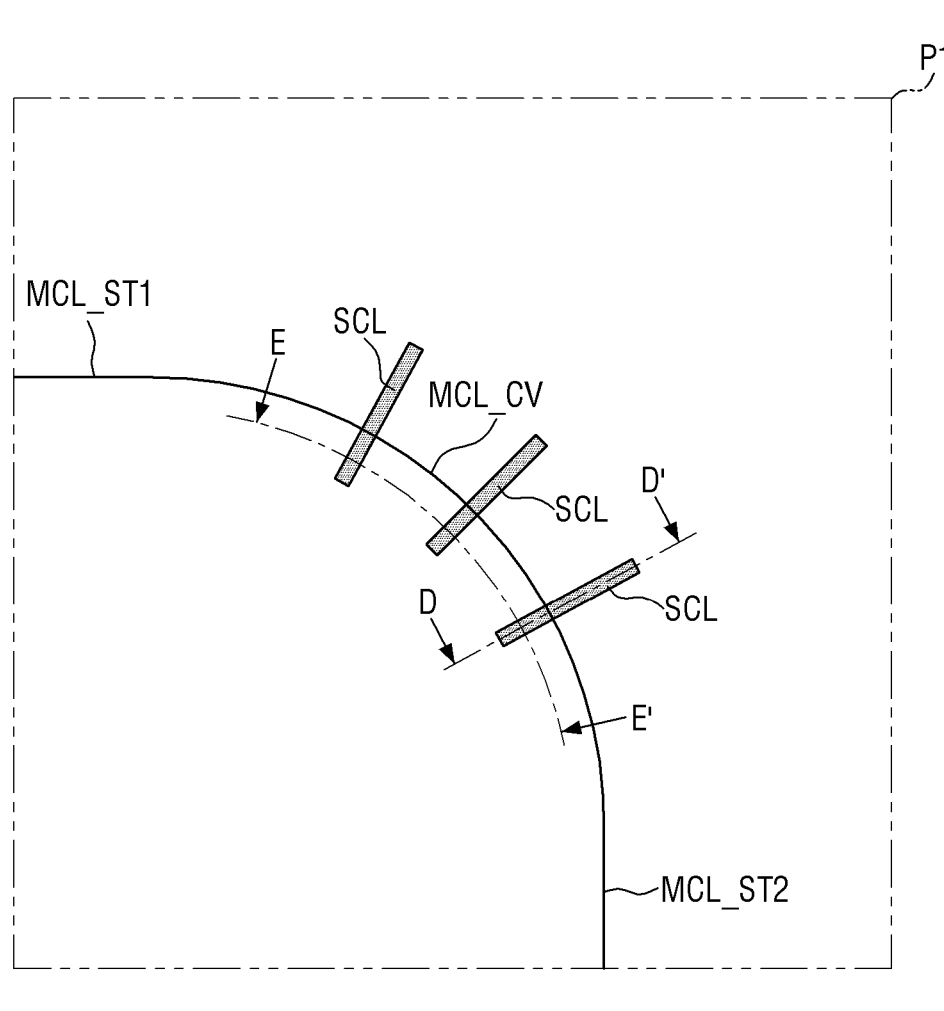
Figure 14:
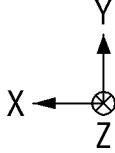

Referring to FIGS. 13 and 14, the forming the main cutting line MCL may include forming straight lines MCL_ST1 and MCL_ST2 and curved lines MCL_CV disposed therebetween. Referring to FIGS. 3 and 6, the longer sides or the shorter sides of the display panel DP may be formed by straight lines MCL_ST1 and MCL_ST2, and the corners CR may be formed by the curved lines MCL_CV.

Subsidiary cutting lines SCL may be formed by the second cutting process. The subsidiary cutting lines SCL may be formed on at least one of the curved lines MCL_CV of the main cutting line MCL.

The subsidiary cutting lines SCL may be extended in directions intersecting the curved line MCL_CV. For example, the subsidiary cutting lines SCL may be extended in directions perpendicular to the normal line of the curved line MCL_CV, but the disclosure is not limited thereto.

Parts of the subsidiary cutting lines SCL may be located on the inner side of the main cutting line MCL, and the other parts of the subsidiary cutting lines SCL may be located on the outer side of the main cutting line MCL. The length of the other parts of the subsidiary cutting lines SCL may be greater than the length of the parts of the subsidiary cutting lines SCL, but the disclosure is not limited thereto.

Referring further to FIG. 7, the parts of the subsidiary cutting lines SCL may include the groove parts CTP. The positions of the subsidiary cutting lines SCL and width or interval at which they may be arranged may be substantially the same as or similar to the grooves CTP. Since the positions of the grooves CTP and the width or interval at which they may be arranged may be the same as described above; and, therefore, redundant descriptions will be omitted.

The display panel DP, the upper stack structure USS and the lower stack structure LSS shown in FIGS. 15 and 16 are upside down.

Referring to FIGS. 15 and 16, the main cutting line MCL may penetrate through all of the upper stack structure USS, the display panel DP, the lower stack structure LSS, the adhesive layer AD and the carrier layer CL. On the other hand, the subsidiary cutting lines SCL may be formed to completely penetrate the carrier layer CL and the adhesive layer AD, but only partially penetrate the polymer film layer PF facing the adhesive layer AD. As a result, in case that the subsidiary cutting lines SCL may be formed, grooves CTP as shown in FIGS. 8 and 9 may be formed in the lower surface of the polymer film layer PF. Burrs by laser cutting may be formed in the subsidiary cutting lines SCL and each of the grooves CTP included therein. It is, however, to be understood that the disclosure is not limited thereto. The subsidiary cutting lines SCL may be formed to penetrate at least a part of the carrier layer CL and the adhesive layer AD, or may be formed to penetrate at least a part of the carrier layer CL.

Referring to FIG. 16, in a cross section cut parallel to the curved line MCL_CV, the subsidiary cutting lines SCL may have a tapered shape, e.g., the width becomes narrower toward the upper side and/or toward the display panel DP. The upper side may refer to the side on which images may be displayed or the screen may be located. In such case, the tip of each of the subsidiary cutting lines SCL adjacent to the display panel DP may have a generally round shape. However, the shape of each of the subsidiary cutting lines SCL is not limited thereto. Each of the subsidiary cutting lines SCL may have various shapes such as a rectangle, a square, a triangle, a circle and an oval in cross section.

Figure 17:
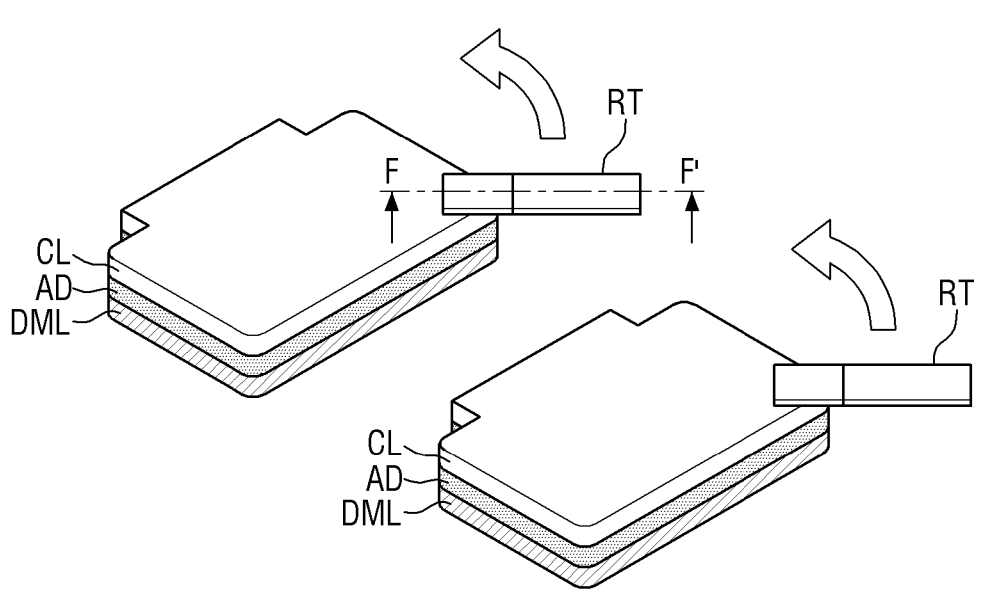

Referring to FIG. 17, after the second cutting process has been completed, a part of the display module mother substrate MS located on the inner side of the main cutting line MCL may be separated from the other part. Although not shown in the drawings, the other part of the display module mother substrate MS may be removed by a scraper device or the like.

Figure 18:
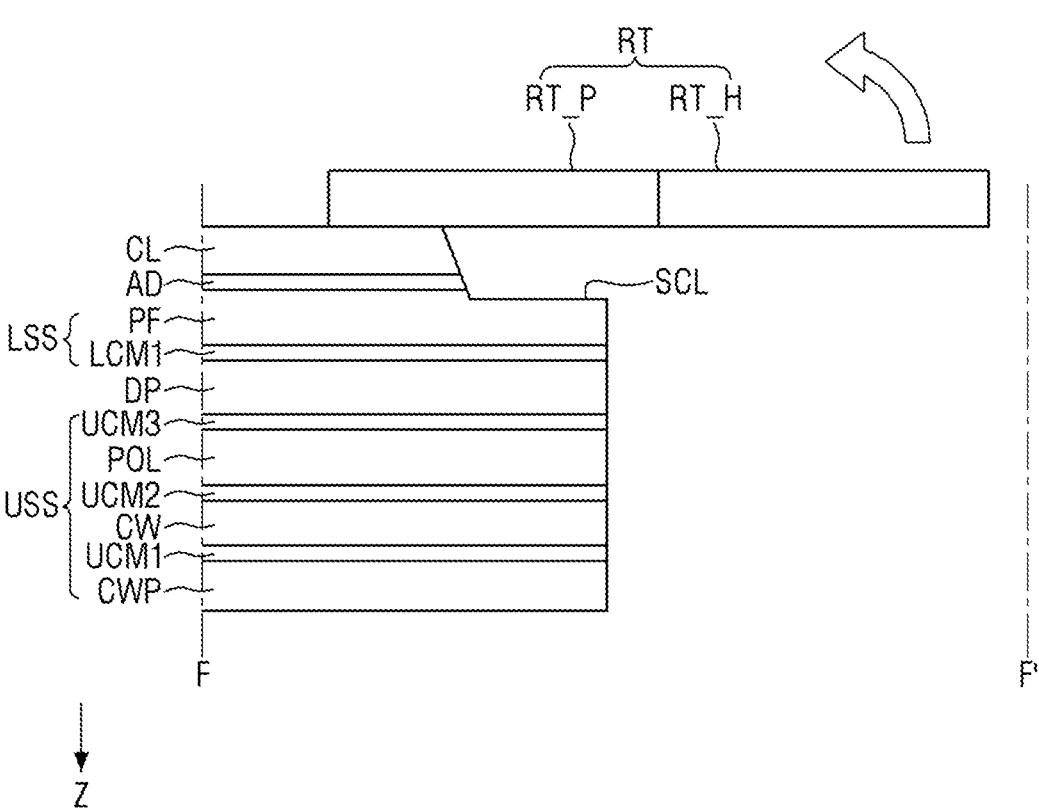

Referring to FIGS. 17 and 18, subsequently, a process of delaminating the carrier layer CL may be performed. The delamination process may be carried out using a removal member RT. For example, the removal member RT may be, but is not limited to, a removal tape.

The removal member RT may be attached to the curved line MCL_CV of the main cutting line MCL on which the subsidiary cutting lines SCL may be formed. According to an embodiment of the disclosure, the removal member RT may include an adhesive portion coated with an adhesive material and a handle portion connected to the adhesive portion. The removal member RT may be attached such that the adhesive portion overlaps the subsidiary cutting lines SCL. As shown in FIGS. 17 and 18, the adhesive portion has a length longer than the subsidiary cutting lines SCL remaining on the inner side of the main cutting line MCL, and thus the subsidiary cutting lines SCL may be covered by the adhesive portion.

After the removal member RT has been attached, the handle portion of the removal member RT may be pulled, so that a carrier film and the adhesive layer AD to which the removal member RT may be attached may be delaminated. The delamination may be carried out by, but is not limited to, a device such as a robot arm.

The adhesive strength of the adhesive layer AD may vary depending on the object to be attached. According to an embodiment of the disclosure, the adhesive layer AD may have a greater adhesive strength to the carrier layer CL than the polymer film layer PF, and thus may be delaminated together with the carrier film.

After the carrier layer CL has been delaminated, the grooves CTP as shown in FIGS. 6 to 9 may be left in the polymer film layer PF as traces of the subsidiary cutting lines SCL.

Referring to FIGS. 3 and 4, after the carrier layer CL has been delaminated, the driving member DDM and the printed circuit board PCB may be attached. At least one layer may be further laminated on the display panel DP.

In a method of fabricating a display device according to an embodiment, by employing the second cutting process that relieves the coupling force between the adhesive layer AD and the polymer film layer PF, the delamination of the carrier layer CL is facilitated. For example, in case that the adhesive layer AD is made of a pressure-sensitive adhesive and the polymer film layer PF is made of heat-resistant polyethylene terephthalate, the adhesive layer AD and the polymer film layer PF can be coupled with a relatively strong adhesive force. The adhesive strength may refer to detachably adhesive strength. As shown in FIG. 17, if the carrier layer CL may be shaped together with the display panel DP, it may be impossible to form a handle for delamination, and the edges of the carrier layer CL, the adhesive layer AD and the polymer film layer PF may be fused by a laser. As a result, delamination may be difficult. Accordingly, in case that the carrier layer CL is delaminated, the carrier layer CL may not be easily delaminated, or a layer having a relatively weak coupling force, e.g., the encapsulation layer ENL may be detached. In a method of fabricating a display device according to an embodiment, by applying damage to the curved line MCL_CV of the main cutting line MCL with a laser or the like in advance to weaken the coupling force between the adhesive layer AD and the polymer film layer PF, the force required for delaminating the carrier layer CL can be reduced, and thus it may be possible to prevent deformation and/or damage to the display panel DP and the structure stacked thereon. No time for reinforcing the adhesive strength of the adhesive layer AD or no additional plasma treatment process may be required.

FIGS. 19 to 21 are schematic views showing processing steps of a method of fabricating a display device according to another embodiment of the disclosure.

The embodiment of FIGS. 19 to 21 may be different from the embodiment of FIGS. 11 to 13 in that subsidiary cutting lines SCL may be formed prior to a main cutting line MCL.

Referring to FIG. 19, a carrier layer CL may be prepared. The carrier layer CL may have an adhesive layer AD attached thereto. The carrier layer CL and the adhesive layer AD may not be attached to a display module layer DML.

Subsequently, a first cutting process may be carried out. Subsidiary cutting lines SCL may be formed on the carrier layer CL and the adhesive layer AD at positions by the first cutting process. At the positions, curved lines MCL_CV of the main cutting lines MCL may be formed. The subsidiary cutting lines SCL may be formed by laser cutting. The subsidiary cutting lines SCL may be formed to completely penetrate the carrier layer CL and the adhesive layer AD. The carrier layer CL may be fully cut by a laser.

Referring to FIG. 20, after the first cutting process, the carrier layer CL and the adhesive layer AD may be laminated on the display module layer DML. The adhesive layer AD may be interposed between the carrier layer CL and the adhesive layer AD. In FIG. 20, the adhesive layer AD may be first formed on the carrier layer CL and attached to the display module layer DML, but the disclosure is not limited thereto. Although not shown in the drawings, the carrier layer CL may be laminated on the adhesive layer AD previously formed on the display module layer DML.

Referring to FIG. 21, after the carrier layer CL and the adhesive layer AD have been laminated, a second cutting process may be carried out. The main cutting line MCL penetrating the carrier layer CL, the adhesive layer AD and the display module layer DML may be formed by the second cutting process. The carrier layer CL, the adhesive layer AD and the display module layer DML may be fully cut by a laser.

Referring to FIGS. 17 and 18, subsequently, a process of delaminating the carrier layer CL and the adhesive layer AD may be carried out.

The embodiment of FIGS. 19 to 21 may be substantially identical to the embodiment of FIGS. 11 to 18 except the order of forming the main cutting line MCL and the subsidiary cutting lines SCL; and, therefore, redundant descriptions will be omitted.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a display panel comprising:
        a surface where images are displayed; and
        an opposite surface; and
    a polymer film layer disposed on the opposite surface of the display panel and supporting the display panel,
    wherein the polymer film layer comprises grooves partially penetrating the polymer film layer, extending in a horizontal direction, and recessed toward the display panel in a vertical direction, and
    wherein each groove has a vertically closed end portion, a vertically open end portion, a laterally closed end portion, and a laterally open end portion.

2. The display device of claim 1, wherein the polymer film layer comprises:

sides extending in different horizontal directions; and a corner connecting the sides, and wherein the grooves are in the corner and extend in diagonal horizontal directions with respect to the sides, wherein each groove extends from an outer edge portion of the corner toward an inner portion of the corner spaced apart from the outer edge portion, wherein the laterally closed end portion of each groove is at the inner portion of the corner, and wherein the laterally open end portion of each groove is at the outer edge portion of the corner.

3. The display device of claim 2, wherein the corner of the polymer film layer are aligned with an edge portion of the display panel in a thickness direction.

4. The display device of claim 2, wherein a distance between the laterally open end portions of adjacent grooves is greater than a distance between the laterally closed end portions of the adjacent grooves.

5. The display device of claim 4, wherein each of the grooves extends toward a center of curvature of the corner.

6. The display device of claim 2, wherein the display panel comprises:

a main region including a display area;

a bending region extending from the main region; and a subsidiary region extending from the bending region, and the grooves are located at the corner that is located in the main region.

7. The display device of claim 1, wherein the polymer film layer comprises heat-resistant polyethylene terephthalate.

8. The display device of claim 1, wherein each of the grooves comprises a burr.

9. The display device of claim 1, further comprising:

an upper stack structure disposed on an upper surface of the display panel.

10. The display device of claim 1, wherein the display panel comprises:

a substrate;

a circuit driving layer on the substrate;

an emissive layer on the circuit driving layer; and an encapsulation layer on the emissive layer.

11. The display device of claim 1, wherein the polymer film layer comprises:

sides extending in different horizontal directions; and a corner having a curved outer edge portion and connecting the sides, and wherein the grooves comprise:

a first groove extending in a first horizontal direction in plan view and having a first laterally open end portion, a second groove spaced apart from the first groove and extending in a second horizontal direction different from the first horizontal direction in plan view and having a second laterally open end portion, and a third groove spaced apart from the first groove and the second groove, the third groove extending in a third horizontal direction different from the first horizontal direction and the second horizontal direction in plan view and having a third laterally open end portion, and wherein the first, second, and third laterally open end portions are aligned along the curved outer edge portion of the corner.

\* \* \* \* \*